(12) United States Patent
Suh et al.

(10) Patent No.: US 7,582,894 B2
(45) Date of Patent: Sep. 1, 2009

(54) ORGANIC THIN FILM TRANSISTOR

(75) Inventors: Min-Chul Suh, Suwon-si (KR);
Jae-Bon Koo, Suwon-si (KR); Taek Ahn, Suwon-si (KR)

(73) Assignee: Samsung Mobile Displays Co., Ltd., Suwon-si (KR)

(*) Notice: Subject to any disclaimer, the term of this patent is extended or adjusted under 35 U.S.C. 154(b) by 486 days.

(21) Appl. No.: 11/280,105

(22) Filed: Nov. 15, 2005

(65) Prior Publication Data
US 2006/0102896 A1 May 18, 2006

(30) Foreign Application Priority Data
Nov. 15, 2004 (KR) .................. 10-2004-0093000

(51) Int. Cl.
*H01L 35/24* (2006.01)
*H01L 51/00* (2006.01)
(52) U.S. Cl. .............. 257/40; 257/57; 257/E29.151; 438/99
(58) Field of Classification Search ............ 257/40, 257/57, 643, E51.005, E29.151; 438/99
See application file for complete search history.

(56) References Cited

U.S. PATENT DOCUMENTS

| 7,202,495 | B2* | 4/2007 | Unno | 257/40 |
| 7,224,421 | B1* | 5/2007 | Takeda et al. | 349/129 |
| 2002/0039166 | A1* | 4/2002 | Song | 349/156 |
| 2003/0080426 | A1 | 5/2003 | Klauk et al. | |
| 2004/0178428 | A1 | 9/2004 | Chou et al. | |
| 2004/0209388 | A1 | 10/2004 | Cheng et al. | |
| 2005/0064623 | A1 | 3/2005 | Bao | |
| 2005/0074914 | A1* | 4/2005 | Chang et al. | 438/48 |
| 2005/0185107 | A1* | 8/2005 | Ban et al. | 349/42 |
| 2006/0033208 | A1* | 2/2006 | Arkhipov et al. | 257/734 |
| 2007/0012922 | A1* | 1/2007 | Harada et al. | 257/66 |

FOREIGN PATENT DOCUMENTS

| JP | 2004-274015 | 9/2004 |
| JP | 2004-318058 | 11/2004 |
| JP | 2005-150328 | 6/2005 |
| KR | 1020050034840 A | 4/2005 |
| WO | WO 2004/088765 | 10/2004 |

OTHER PUBLICATIONS

Notice to Submit Response by Korean Intellectual Property Office issued on Jun. 26, 2006.

* cited by examiner

*Primary Examiner*—Phuc T Dang
(74) *Attorney, Agent, or Firm*—Knobbe Martens Olson & Bear LLP

(57) ABSTRACT

Organic TFTs having uniform characteristics and a flat panel display having the organic TFT, wherein the organic TFTs include an organic semiconductor layer formed by spin coating are disclosed. One embodiment of the organic TFT includes: a substrate, a gate electrode disposed on the substrate, a gate insulating film covering the gate electrode, an organic semiconductor layer disposed on the gate insulating film, and a source electrode and a drain electrode that contact the organic semiconductor layer, wherein a plurality of protrusion parts is formed on the gate insulating film and the protrusion parts extend toward the drain electrode from the source electrode.

34 Claims, 23 Drawing Sheets

ORGANIC THIN FILM TRANSISTOR

This application claims the priority of Korean Patent Application No. 10-2004-0093000 filed on Nov. 15, 2004 in the Korean Intellectual Property Office, the disclosure of which is incorporated herein in its entirety by reference.

BACKGROUND OF THE INVENTION

1. Technical Field

The invention relates to organic thin film transistors (organic TFT).

2. Discussion of Related Technologies

The development of polyacetylene, a conjugated organic polymer having semiconductor characteristics, has opened the possibility to use organic polymer transistors in electronic and optical devices. The organic polymer is advantageous in that it can be synthesized using various methods, can be readily molded into a film shape, has good flexibility and electric conductivity, and has a low production cost.

A conventional silicon TFT includes a semiconductor layer formed of silicon, source and drain regions doped with a high concentration dopant, a channel region between the source region and the drain region, a gate electrode disposed on a region corresponding to the channel region and insulated from the semiconductor layer, and source and drain electrodes respectively connected to the source and drain regions.

Some disadvantages of conventional silicon TFTs are that they are expensive to manufacture and can easily break by an external impact. Furthermore, the manufacturing process requires high temperatures (over 300° C.), which precludes the use of a plastic substrate.

In flat displays such as liquid crystal displays (LCDs), or electroluminescence displays (ELD), TFTs are used as a switching device that controls the operation of each pixel and a driving device for driving each pixel. It has been attempted to use a plastic (opposed to glass) substrate to produce flat panel displays that are large, thin, and possess the desired flexibility characteristics. However, when the plastic substrate is used, a lower temperature process must be employed, which precludes the use of conventional silicon TFTs.

The use of an organic material for the semiconductor layer may help resolve this because it can be formed at lower temperatures.

However, the characteristics of a plurality of simultaneously manufactured TFTs that include an organic semiconductor layer may not be identical with respect to each of the TFTs.

FIG. 1 is a cross-sectional view illustrating an inverted coplanar type organic TFT. FIGS. 2A through 2C are conceptual cross-sectional views that illustrate a conventional coating process for forming an organic semiconductor layer using a spin coating method. FIG. 3A is a plan view that illustrates, in conjunction with FIGS. 3B and 3C, how physical characteristics within the organic semiconductor layer formed by this method may vary at different locations within the organic semiconductor layer. FIGS. 3B and 3C are enlarged plan views of respective portion A and portion B of the organic semiconductor layer of FIG. 3A.

Referring to FIG. 1, an organic semiconductor layer 30 covering a gate electrode 20, a gate insulating film 60, a source electrode 40, and a drain electrode 50 are formed over a substrate 10 using a spin coating method as depicted in FIGS. 2A through 2C. Referring to FIGS. 2A through 2C, an organic semiconductor layer 3 is formed by dropping an organic material 3a on the substrate 1 through a nozzle 2. The substrate 1 is rotated to create a centrifugal force that distributes the material 3a across the surface of the substrate 1, thereby forming the organic semiconductor layer.

However, the spin coating method creates an organic semiconductor layer 3 that is non-uniform. As depicted in FIG. 3A, spin coating may cause the organic semiconductor layer 3 to form in multiple directions. For example, portions of the organic semiconductor layer 3 at different locations, such as those represented by A and B in FIGS. 3A-3C, may be formed with the material in each portion having an orientation in a different direction than any other given portion.

Portions of organic TFTs formed in different directions, such as those represented by A and B, have different characteristics of threshold voltage. As a result, when a flat panel display is manufactured using organic TFTs formed by spin coating, high-resolution images according to the input image signals cannot be displayed.

SUMMARY OF CERTAIN INVENTIVE ASPECTS

One embodiment of the invention provides a plurality of organic TFTs in which an organic semiconductor layer is formed using a spin coating method. Generally, the TFTs have substantially identical characteristics, and a flat panel display may comprise the organic TFTs.

According to one embodiment present invention, there is provided an organic thin film transistor (TFT) comprising: a substrate; a gate electrode disposed on the substrate; a gate insulating film covering the gate electrode; an organic semiconductor layer disposed on the gate insulating film; and a source electrode and a drain electrode that contact the organic semiconductor layer; a plurality of protrusions formed on the gate insulating film that are arranged in an orientation that extends from the source electrode to the drain electrode.

In some embodiments, the protrusions are arranged in parallel alignment.

The organic TFT can further comprise a plurality of protrusion members formed on a surface of the gate electrode that faces the gate insulating film. The protrusion members can be arranged in an orientation that extends from the source electrode to the drain electrode.

In some embodiments of the invention, the protrusion members are arranged in a parallel alignment. They can also be formed of a photosensitive material that can be one of a photoresist and a photoaligning material. The protrusion members can be integrally formed as one body with the gate electrode.

The organic TFT can further comprise a buffer layer formed between the substrate and the gate electrode. The organic TFT can further comprise a plurality of protrusion members on a surface of the buffer layer that faces the gate electrode, and the protrusion members may be arranged in an orientation that extends from the source electrode to the drain electrode.

In some embodiments of the invention, the protrusion members formed on the buffer layer are arranged in a parallel alignment. They can also be formed of a photosensitive material that can be one of a photoresist and a photoaligning material. The protrusion members can be integrally formed as one body with the buffer layer.

According to one aspect of the present invention, the buffer layer can be formed of a photosensitive material that can be one of a photoresist and a photoaligning material.

The organic TFT can further comprise a plurality of protrusion members on a surface of the substrate. The protrusion members can be formed on the surface of the substrate facing the gate electrode. The protrusion members can be may be arranged in an orientation that extends from the source electrode to the drain electrode. The protrusion members formed on the substrate are arranged in a parallel alignment. They can also be formed of a photosensitive material that can be one of a photoresist and a photoaligning material. The protrusion members can be integrally formed as one body with the buffer layer. According to an aspect of the present invention, there is provided a flat panel display that comprises the plurality of these TFTs.

In another embodiment of the invention, there is provided an organic TFT comprising: a substrate; a gate electrode disposed on the substrate; a gate insulating film covering the gate electrode; an organic semiconductor layer disposed on the gate insulating film; a source electrode and a drain electrode that contact the organic semiconductor layer; and a plurality of protrusion members formed on a surface of the gate insulating film. The protrusion members may be formed on a first surface that is opposite the surface of the gate insulating film that contacts the gate electrode. The protrusion members may be arranged in an orientation that extends from the source electrode to the drain electrode. The protrusion members can be arranged in a parallel alignment. The protrusion members may be formed of a photosensitive material that may be a photoresist or a photoaligning material. The protrusion members may also be integrally formed as one body with the gate insulating film. In some embodiment, the gate insulating film is formed of a photosensitive material that may be a photoresist or a photoaligning material. In some embodiments of the invention, a flat panel display is provided that comprises a plurality of these TFTs.

In other embodiments of the invention, an organic TFT comprise a substrate; an organic semiconductor layer disposed on the substrate; a gate electrode insulated from the organic semiconductor layer; and a source electrode and a drain electrode contacting the organic semiconductor layer and insulated from the gate electrode; a plurality of protrusion members formed on a surface of the substrate that faces the organic semiconductor layer. The protrusion members may be arranged in an orientation that extends from the source electrode to the drain electrode. The protrusion members may also be arranged in a parallel alignment. In some embodiments, the protrusion members are formed of a photosensitive material, which could be a photoresist or a photoaligning material. The protrusion members may also be integrally formed as one body with the substrate. The organic TNT may further comprise a buffer layer formed between the substrate and the organic semiconductor layer. The organic TNT may further comprise a gate insulating film that insulates the source electrode, the drain electrode, and the organic semiconductor layer from the gate electrode and is disposed on the organic semiconductor layer.

The invention may be a flat panel display that comprises any the embodiments of the TFTs.

In another embodiment, the invention is an organic TFT comprising: a substrate; a buffer layer disposed on the substrate; an organic semiconductor layer disposed on the buffer layer; a gate electrode insulated from the organic semiconductor; a source electrode and a drain electrode contacting the organic semiconductor layer and insulated from the gate electrode; a plurality of protrusion members formed on a surface of the buffer layer that faces the organic semiconductor layer. The protrusion members may be arranged in an orientation that extends from the source electrode to the drain electrode. The protrusion members may be arranged in a parallel alignment. In some embodiments, the protrusion members are formed of a photosensitive material, which may be a photoresist or a photoaligning material. The protrusion members may also be formed as one body with the buffer layer. In some embodiments, the buffer layer is formed of a photosensitive material, which may be a photoresist or a photoaligning material. This embodiment may further comprise a gate insulating film that insulates the source electrode, the drain electrode, and the organic semiconductor layer from the gate electrode and is disposed on the organic semiconductor layer.

In another embodiment, an organic thin film transistor (TFT) comprises a substrate; a plurality of surfaces; and a plurality of protrusions that are oriented in a pre-determined direction and are formed on a first surface of the organic TFT. An organic semiconductor layer may be formed on the first surface, and at least a portion of the organic semiconductor layer may be formed in the pre-determined direction. The protrusions may be arranged in a parallel alignment. In some embodiments, the TFT may further comprise a gate electrode and a plurality of protrusion members formed on a surface of the gate electrode. The protrusion members may be arranged in a parallel alignment. The protrusion members may also be formed of a photosensitive material, which may be a photoresist or a photoaligning material. The protrusion members may also be integrally formed with the gate electrode. The TFT may further comprise a buffer layer formed between the substrate and the gate electrode. In some embodiments, a plurality of protrusion members is formed on a surface of the buffer layer. The protrusion members may be arranged in a parallel alignment. The protrusion members may be formed of a photosensitive material, which may be a photoresist or a photoaligning material. The protrusion members may be integrally formed as one body with the buffer layer. The buffer layer may also be formed of a photosensitive material, which may be a photoresist or a photoaligning material. The protrusion members may also be on a surface of the substrate. The protrusion members may be arranged in a parallel alignment. In some embodiments, the protrusion members are formed of a photosensitive material, which may be a photoresist or a photoaligning material. The protrusion members may also be integrally formed as one body with the substrate. The organic TFT may further comprise a gate insulating film and a plurality of protrusion members formed on a surface of the gate insulating film. The protrusion members may be arranged in a parallel alignment. The protrusion members may be formed of a photosensitive material, which may be a photoresist or a photoaligning material. The protrusion members may be integrally formed as one body with the gate insulating film In another embodiment of the invention, an organic TFT comprises a substrate; a gate electrode; a gate insulating film; an organic semiconductor layer; and a plurality of protrusion members. The protrusion members may be oriented in a pre-determined direction and may be formed on one of the substrate, the gate electrode, and the gate insulating film. A portion of the organic semiconductor layer may be formed in the direction in which the protrusion members extend. The TFT may further comprise a buffer layer, and the protrusion members may be formed on the buffer layer.

BRIEF DESCRIPTION OF THE DRAWINGS

The above and/or other aspects of the invention will become more apparent by describing in detail exemplary embodiments the invention with reference to the attached drawings in which.

DETAILED DESCRIPTION OF CERTAIN INVENTIVE EMBODIMENTS

Some embodiments of the invention will now be described more fully with reference to the accompanying drawings in which embodiments of the invention are shown. The embodiments presented herein are numerically sequenced. This is to provide clarity only, and is not intended to limit the invention to the embodiments presented herein.

Figure 1:
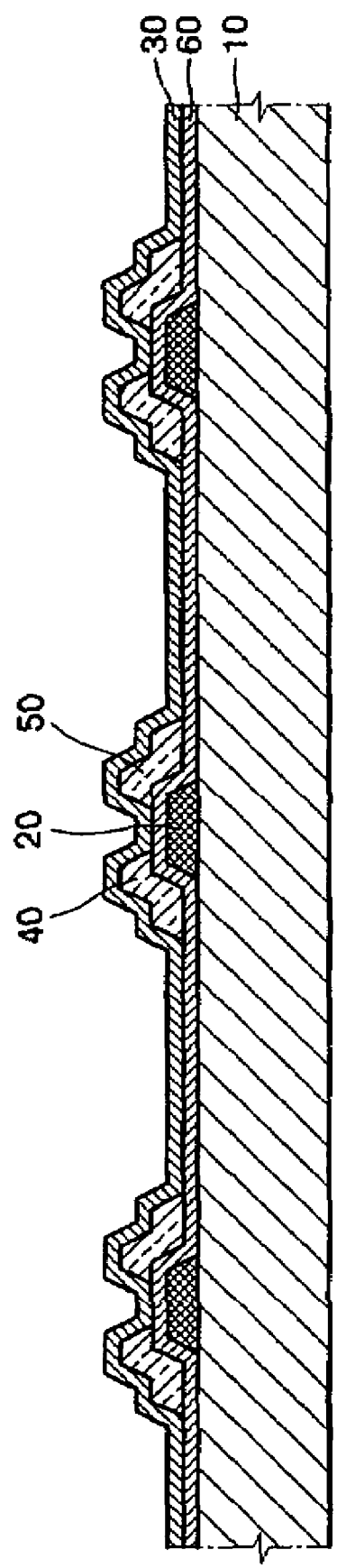
FIG. 1 is a cross-sectional view illustrating conventional inverted coplanar type organic TFTs.
Figure 2A:
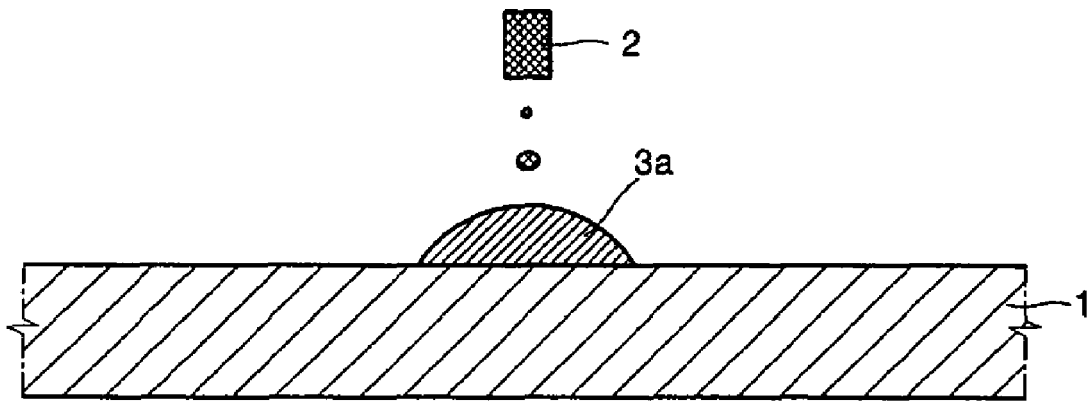
FIGS. 2A through 2C are conceptual cross-sectional views illustrating a conventional coating process for forming an organic semiconductor layer using a spin coating method.
Figure 2B:
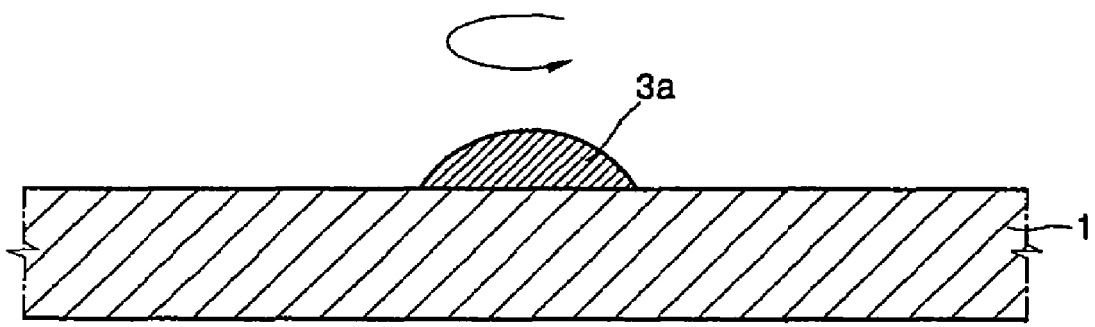
Figure 2C:
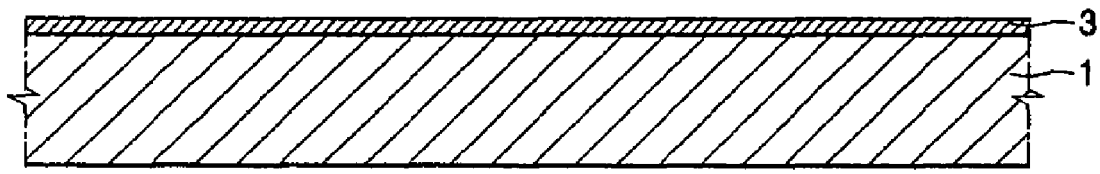
Figure 3A:
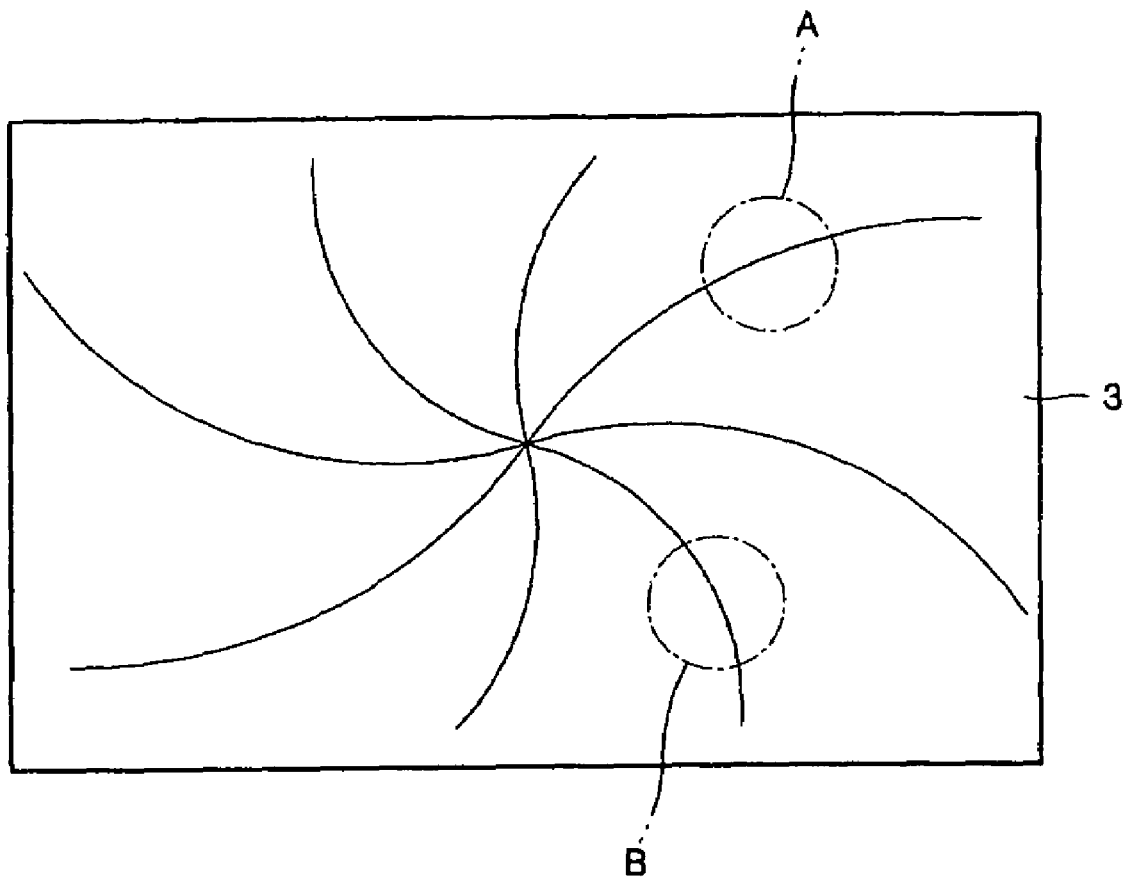
FIG. 3A is a plan view that illustrates exemplary portions of an organic semiconductor layer that is formed using a spin coating method.
Figure 3B:
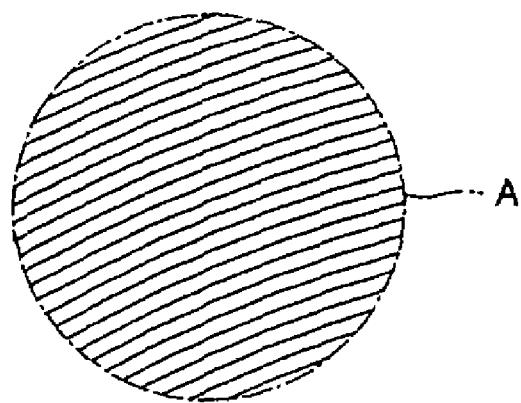
FIGS. 3B and 3C are enlarged plan views of respective portion A and portion B of the organic semiconductor layer of FIG. 3A.
Figure 3C:
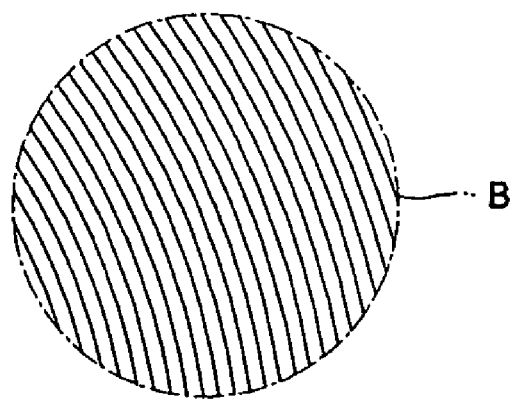
Figure 4A:
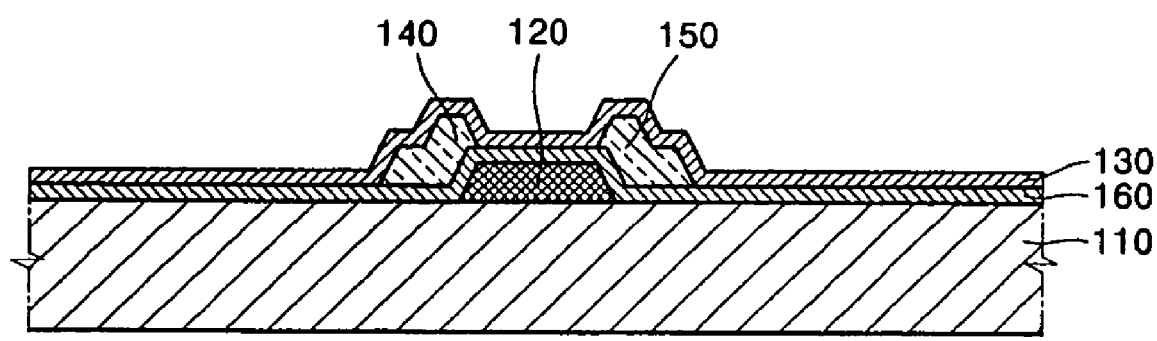
FIG. 4A is a cross-sectional view illustrating an organic TFT according to one embodiment of the invention.
Figure 4A:
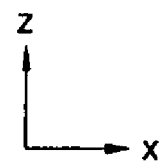
Figure 4B:
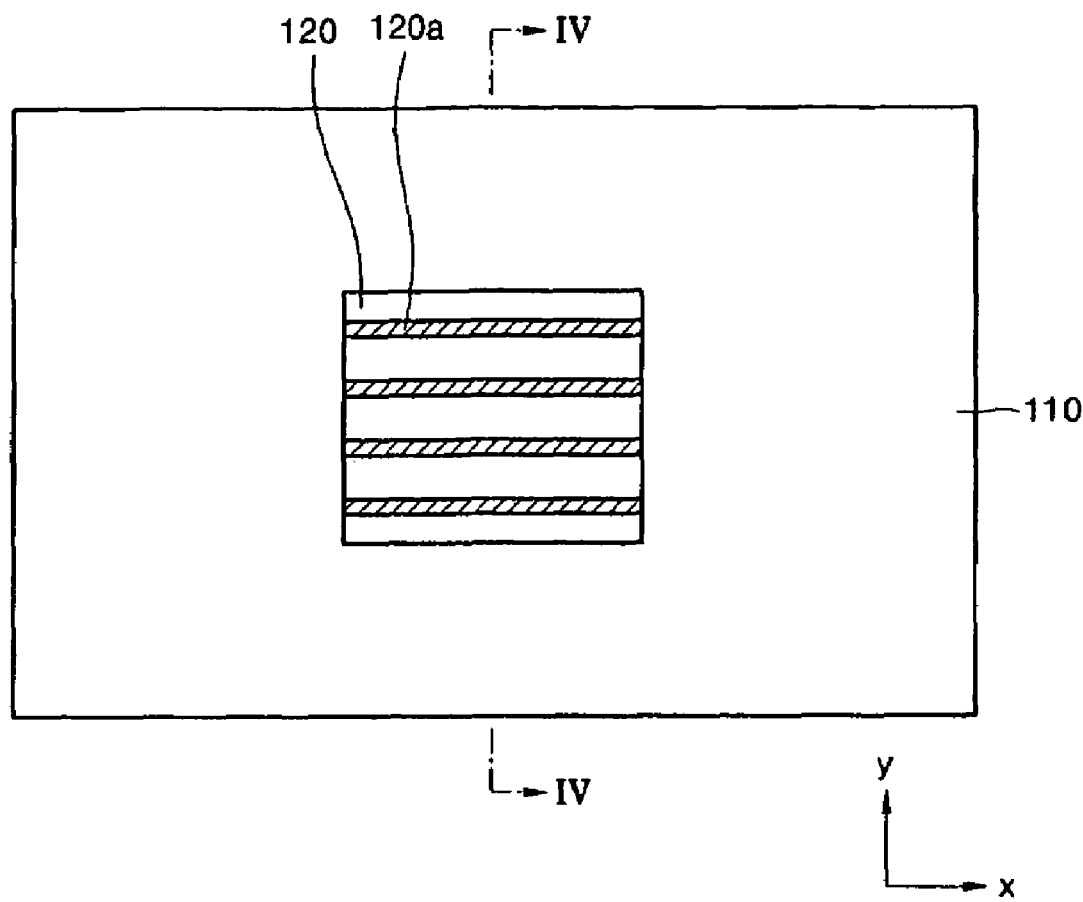
FIG. 4B is a plan view of a portion of the organic TFT of FIG. 4A.
Figure 4C:
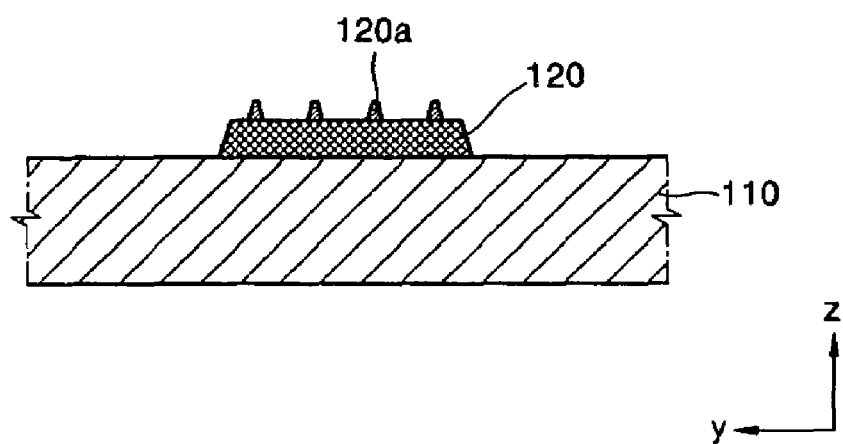
FIG. 4C is a cross sectional view of the portion of the organic TFT of FIG. 4B.
Figure 4D:
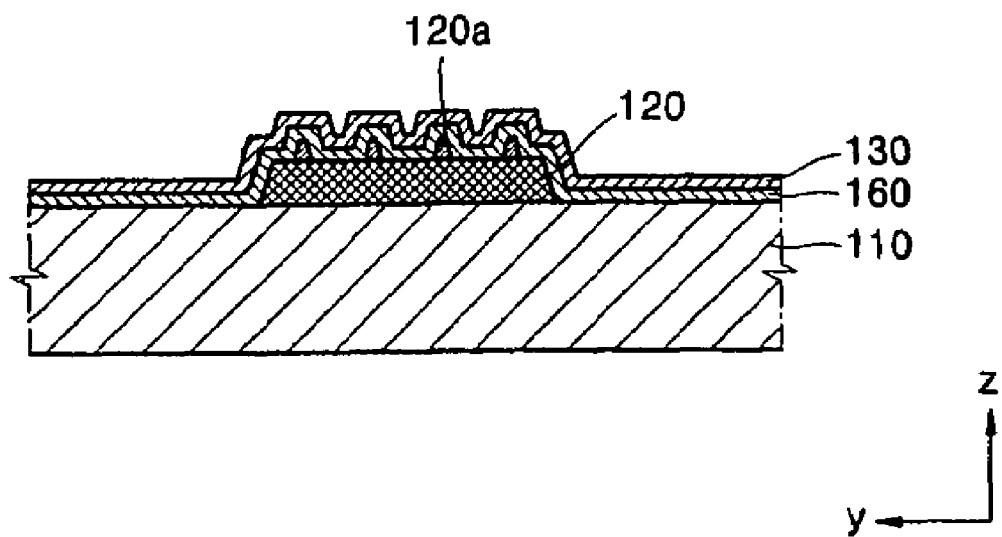
FIG. 4D is a cross sectional view of a portion of the organic TFT of FIG. 4A.
Figure 4E:
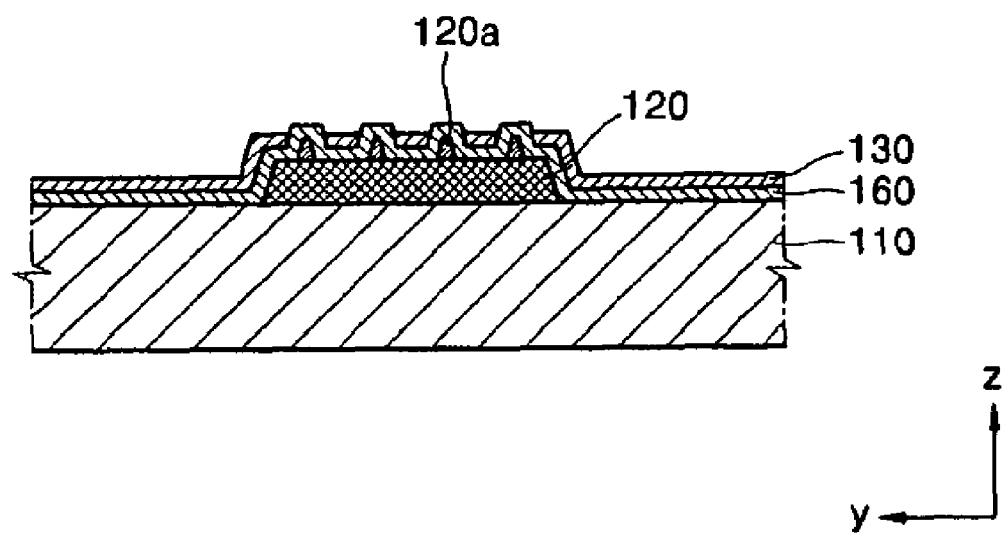
FIG. 4E is a cross sectional view of the organic TFT of FIG. 4A.
Figure 5:
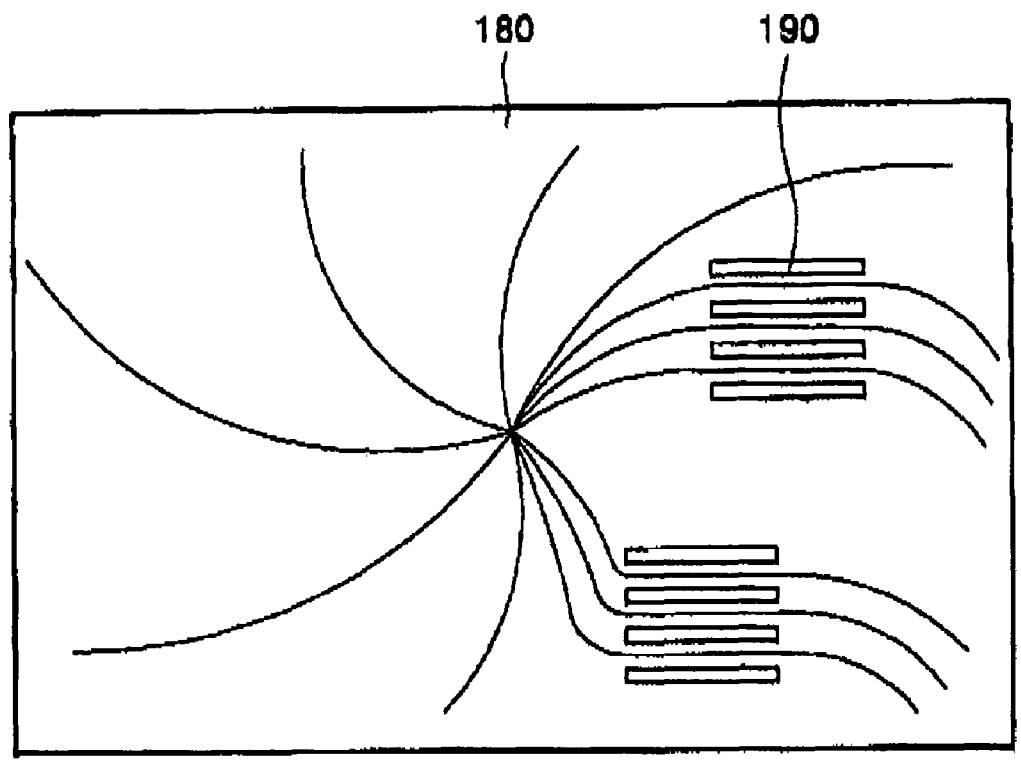
FIG. 5 is a plan view illustrating a principle of obtaining the characteristic uniformity of an organic semiconductor layer of the organic TFT of FIG. 4A.

Referring to FIGS. 4 and 5, one embodiment of an organic TFT includes a gate electrode 120, a gate insulating film 160 that covers the gate electrode 120, an organic semiconductor layer 130 formed over the gate insulating film 160, and source and drain electrodes 140 and 150 that contact the organic semiconductor layer 130, and a substrate 110. Generally, the gate electrode 120 and the gate insulating film 160 are disposed above and are in contact with the substrate 110. In some embodiments, the organic TFT may further comprise a buffer layer (not shown) to prevent the penetration of impurities into the organic semiconductor layer 130 on the substrate 110. Generally, the buffer layer may be included between the substrate and the organic semiconductor layer, and may be included in other embodiments of the invention.

As described above organic materials are generally formed using spin coating. In some embodiments of the invention, the organic material can be formed using spin coating in a predetermined direction by forming a plurality of protrusions that are parallel with respect to each other on a surface to be coated. That is, as depicted in FIG. 5, the organic material 180 may be formed with the parallel protrusions 190. The protrusions 190 are aligned in a parallel orientation during spin coating. Generally, this allows the organic material 180 to be formed in the direction in which the protrusions 190 are oriented. Advantageously, simultaneously manufactured organic TFTs that include organic layers formed by some embodiments of the invention will thus have substantially identical characteristics. Protrusions may be formed on any surface on which the organic semiconductor material is to be formed. The protrusions may take the form of protrusion members. The protrusions may also be formed in layers that are formed over protrusion members.

In some embodiments of the invention, a plurality of protrusions is formed on or as part of the gate insulating film. In all of the embodiments presented below, the protrusions extend in an alignment directed toward the drain electrode from the source electrode. However, it is contemplated that the protrusions may extend in other directions. In the embodiments of the invention presented below, as well as embodiments not specifically described, the protrusions can be parallel or non-parallel with respect to each other. For example, the protrusions can be formed such that they converge as they approach the drain electrode 150. For convenience, the embodiments described herein show configurations of protrusions that are aligned in parallel to extend toward the drain electrode from the source electrode. In some embodiments, an organic semiconductor layer can be formed over the gate insulating film. Generally, the organic semiconductor layer is formed in a direction that is substantially the same as the direction in which parallel protrusions on the gate insulating film extend. Advantageously, this makes it possible to simultaneously manufacture a plurality of organic TFTs having substantially identical characteristics. For example, organic TFTs with a substantially identical threshold voltage can be achieved.

As depicted in the embodiment of FIG. 4D, a plurality of parallel protrusion members 120a may be formed on the top surface of the gate electrode 120. Generally, a gate insulating layer 160 can be formed over the protrusion walls 120a and the gate electrode 120. Forming the gate insulating layer 160 over the protrusion walls 120a will cause corresponding parallel protrusions in the gate insulating layer 160. See FIGS. 4D & 4E. In some embodiments, the organic semiconductor layer 130 is formed to cover the gate insulating film 160, as depicted in FIG. 4D. In other embodiments, the organic semiconductor layer 130 can be formed between the protrusions in the gate insulating layer 160, as depicted in FIG. 4E.

The protrusion members 120a can be formed using various methods, some of which are described below.

In some embodiments, the organic semiconductor layer 130 is formed over the gate insulating film 160. Generally, the protrusions in the gate insulating layer 160 that result from deposition over the protrusion members 120a cause the organic semiconductor layer to be formed in the same orientation as the protrusion members 120a, even when the organic semiconductor layer 130 is formed using a spin coating method. In some embodiments, this makes it possible to simultaneously manufacture a plurality of organic TFTs having substantially identical characteristics.

In some embodiments of the invention, the protrusion members 120a are formed of a photosensitive material. Generally, the photosensitive material can be a polymer film, such as a photoresist or a photoaligning material, but other suitable materials may also be used. The protrusion members of other embodiments of the invention can also be formed of a photosensitive material such as a photoresist or a photoaligning material. The protrusion members 120a, as well as the protrusion members of other embodiments of the invention, can be formed according to the following process.

First, a photoresist is formed on an upper surface of the gate electrode 120. The photoresist can be a positive photoresist or a negative photoresist. A laser may then be used to irradiate the photoresist. A plurality of laser beams that are moved in parallel with respect to each other and that extend in the same direction can be used to irradiate the photoresist.

A laser hologram method can be used to configure the laser beams to irradiate the photoresist. That is, the laser beams having parallel axes to each other and extending in a predetermined direction, which are generated by the interference of two laser beams having an optical path difference (the difference in optical distance), can be used to irradiate the photoresist. The gap between the laser beams can be controlled by controlling the travel alignment of each laser beam. The gap between the laser beams can be in a range of 100-600 nm.

If the plurality of laser beams irradiates a positive photoresist, the bonding force of the portion irradiated by the laser beams is reduced. If the laser beams irradiate a negative photoresist, the bonding force of the portion irradiated by the laser beams increases. After irradiation, the portions where the bonding force is relatively reduced can be removed by a developing process. An annealing process for hardening the protrusion members 120a can further be performed.

The protrusion members 120a can also be formed by creating grooves that are parallel with respect to each other and extend in a predetermined direction. The grooves can be formed using a dynamic rubbing process, in which a polymer film is continuously rubbed in one direction using a fiber. The grooves can also be formed using an optical rubbing process. The protrusion members for other embodiments of the invention described below can be formed as described above or by any other suitable process.

Figure 6:
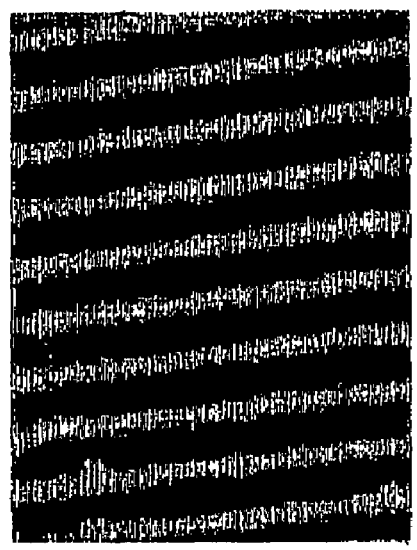
FIG. 6 is a photograph showing a plurality of protrusion parts having parallel axes to each other and being aligned and oriented in a same direction on a gate electrode of the organic TFT of FIG. 4A.

FIG. 6 is a photograph showing a plurality of protrusion members 120a that are oriented in parallel lines and extend in a predetermined direction on the gate electrode 120 of an organic TFT according to one embodiment of the invention.

Figure 7:
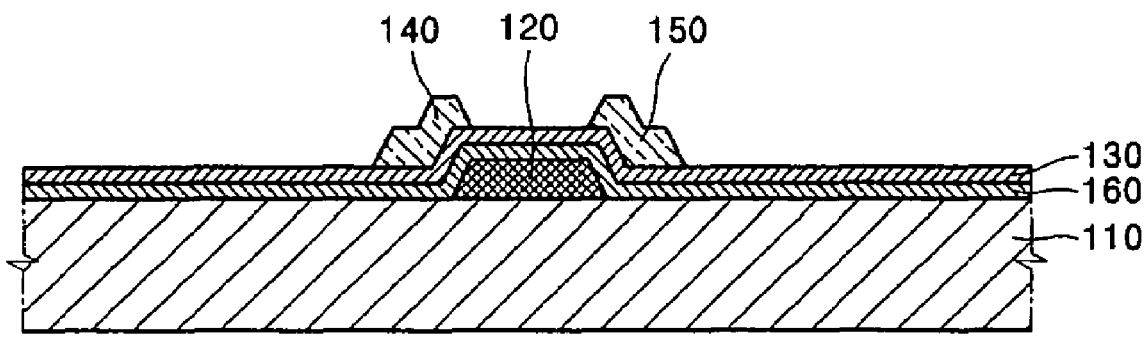
FIG. 7 is a cross-sectional view illustrating another embodiment of an organic TFT.

FIG. 7 is a cross-sectional view illustrating another embodiment of an organic TFT. As depicted in FIG. 4A, the organic TFT of the previous embodiments is an inverted coplanar type organic TFT in which the organic semiconductor layer 130 is formed to cover the source electrode 140 and the drain electrode 150. However, as depicted in FIG. 7, the organic TFT may also be an inverted staggered type organic TFT in which the source electrode 140 and the drain electrode 150 are formed on the organic semiconductor layer 130. In this embodiment, the protrusions can be formed and oriented on the gate insulating film 160 as described above. Generally, the organic semiconductor layer 130 can be formed on the gate insulating film 160 as described above. The organic semiconductor layer is formed over the protrusions such that it has a uniform directionality. Advantageously, this makes it possible to simultaneously manufacture a plurality of organic TFTs having substantially identical characteristics.

In further embodiments of the invention, an organic semiconductor layer is formed on a gate electrode.

Figure 8:
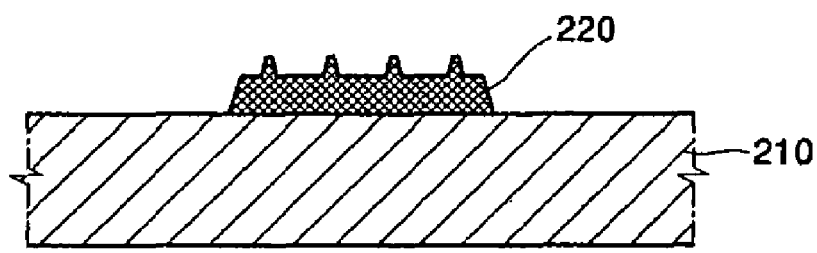
FIG. 8 is a cross-sectional view illustrating a portion of an organic TFT according to another embodiment of the invention.

Referring to FIG. 8, some embodiments include a plurality of protrusion members that are formed on a gate electrode 220. In this embodiment, the protrusion members and the gate electrode 220 are integrally formed as one body without performing an additional process for forming the protrusion parts on the gate electrode 220. Generally, the protrusion members are formed on an upper surface of the gate electrode. See FIG. 8.

A method of forming the protrusion members that are integrally formed with a gate electrode 220 is described later.

In some embodiments, the protrusion members that are integrally formed as one body with the gate electrode 220 are formed using a laser ablation method. Referring to FIG. 8, a laser of predetermined strength may be used to irradiate predetermined portions of a gate electrode 220 after forming the gate electrode 220 on a substrate 210. Generally, the portions of the gate electrode 220 that have been irradiated can be etched to form the protrusion members. The method of forming the protrusion members is not limited to the laser ablation method, and any suitable method can be used to form the protrusion members. Further, the laser ablation method and/or any other suitable method can be used to form protrusion members of other embodiments of the invention. This method is especially applicable to the embodiments in which the protrusion members are integrally formed with the layer, part, or other component on which they are formed.

Referring to FIGS. 9A through 9E, an organic TFT according to a third embodiment will now be described. In this embodiment, the organic TFT includes a gate electrode 320 formed on a substrate 310, a gate insulating film 360 covering the gate electrode 320, an organic semiconductor layer 330 on the gate insulating film 360, and a source electrode 340 and a drain electrode 350 that contact the organic semiconductor layer 330. The organic TFT can further include a buffer layer 370 on an upper surface of the substrate 310.

Figure 9A:
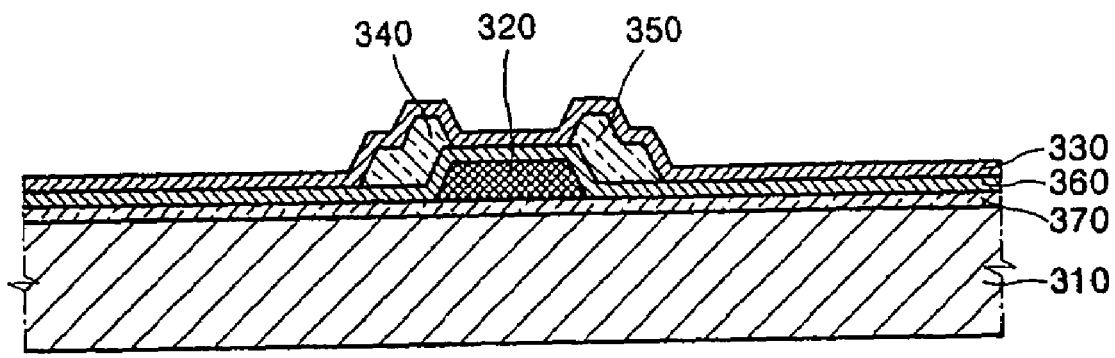
FIG. 9A is a cross-sectional view illustrating an organic TFT according to one embodiment of the invention.
Figure 9B:
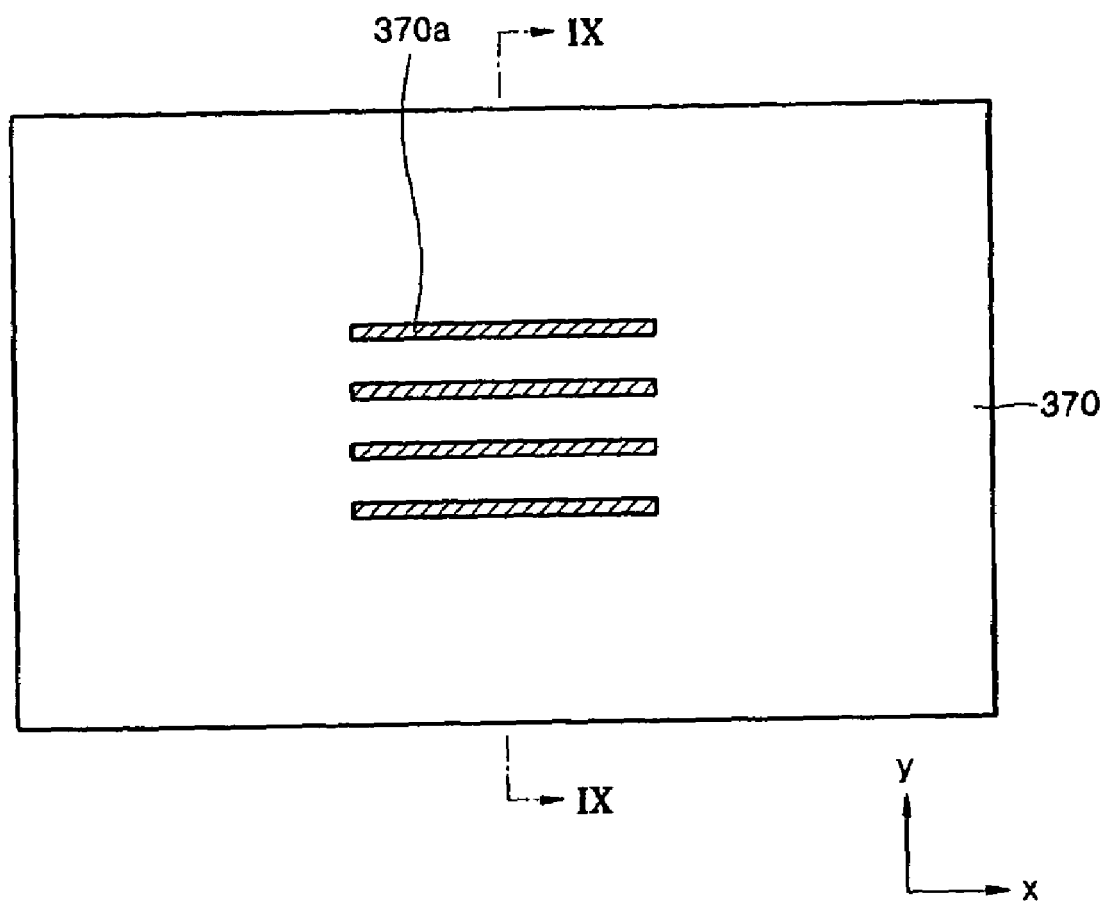
FIG. 9B is a plan view of a portion of the organic TFT of FIG. 9A.
Figure 9C:
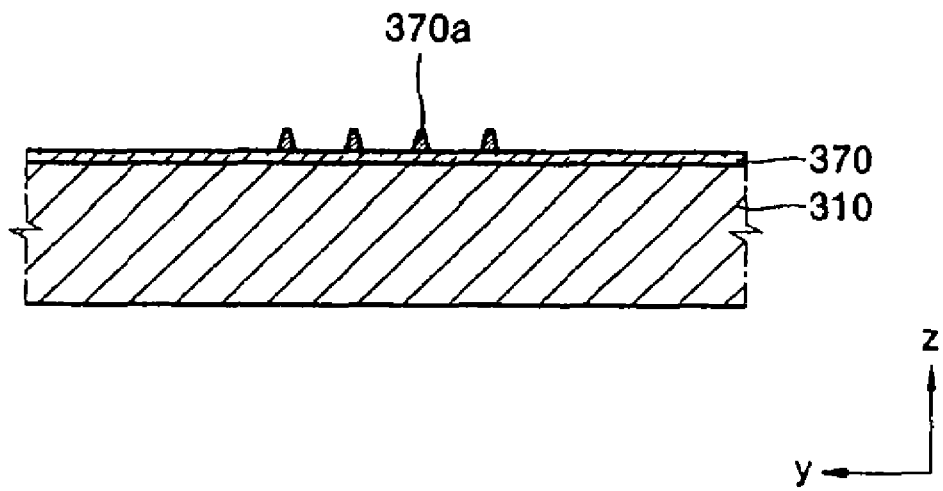
FIG. 9C is a cross sectional view of the portion of the organic TFT of FIG. 9B.
Figure 9D:
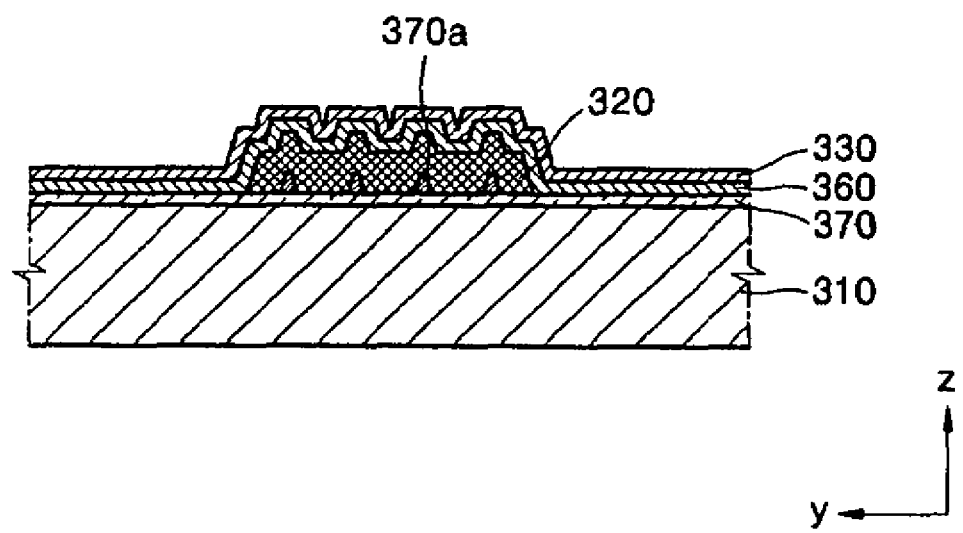
FIG. 9D is a cross sectional view of the organic TFT of FIG. 9A.
Figure 9E:
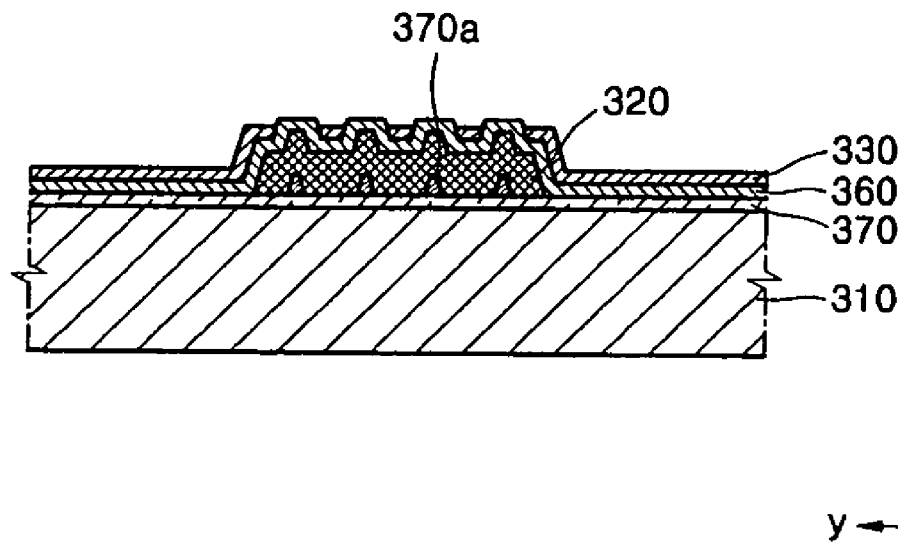
FIG. 9E is a cross sectional view illustrating an organic TFT according to another embodiment of the invention.

As depicted in FIGS. 9D and 9E, a plurality of protrusions may be formed within the gate insulating film 360. As depicted in the embodiment of FIG. 9D, the organic semiconductor layer 330 can be formed to cover the gate insulating film 360 in which a plurality of protrusion members is formed, or, in another embodiment depicted in FIG. 9E, can be disposed between the protrusions. A distinction between this embodiment and the aforementioned embodiments is that the method of forming the protrusions within the gate insulating film 360 is different.

In the case of the organic TFT of the first embodiment, the protrusions are formed within a gate insulating film by forming protrusion members on the gate electrode disposed under the gate insulating film. However, in the organic TFT of the present embodiment, a plurality of protrusions is formed on the gate electrode 320 by forming protrusion members 370a on the buffer layer 370 disposed under the gate electrode 320. Generally, this results in protrusions formed on the gate insulating film 360 formed over the gate electrode 320. As discussed above, and applicable to the other embodiments of the invention, the parallel protrusions formed on the gate insulating film 360 allow an organic semiconductor layer 330 to be formed over the gate insulating film 360 that is aligned in substantially the same direction as the protrusions. Advantageously, this makes it possible to simultaneously manufacture a plurality of organic TFTs having substantially identical characteristics.

Figure 10:
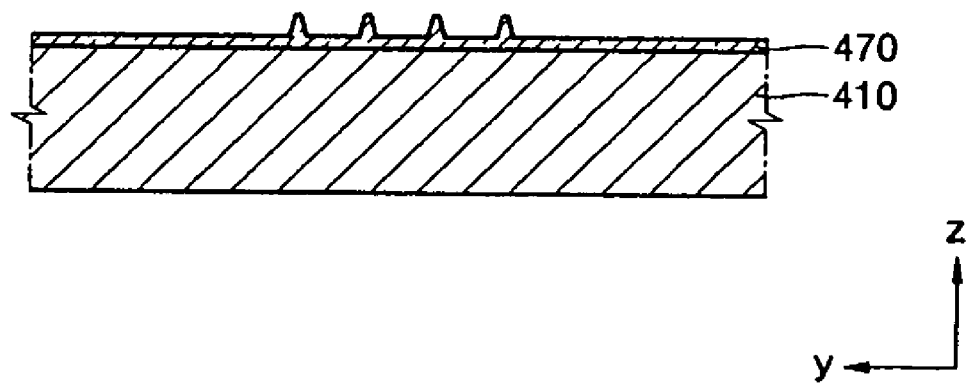
FIG. 10 is a cross-sectional view illustrating a portion of an organic TFT according to yet another embodiment of the invention.

Referring to FIG. 10, another embodiment includes a plurality of protrusion members formed on a buffer layer 470. Generally, the protrusion members are formed integrally as one body with the buffer layer 470 on an upper surface of the buffer layer 470. Generally, the protrusion members result in a plurality of parallel protrusions formed on a gate electrode disposed on the buffer layer 470, as well as a plurality of parallel protrusions formed on the gate insulating film disposed on the gate electrode.

In some embodiments, the protrusion members are formed on an upper surface of the buffer layer using a laser ablation method, as described above. In other embodiments, when the buffer layer is formed using a photosensitive material, the protrusion members can be formed using the laser hologram method described above.

Figure 11A:
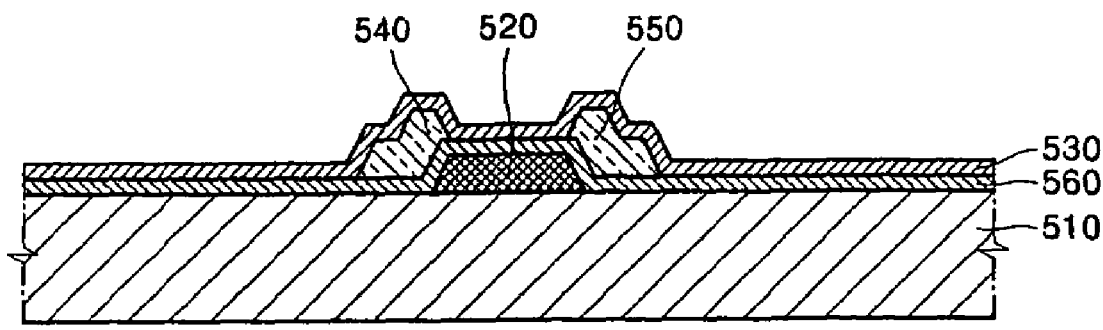
FIG. 11A is a cross-sectional view illustrating an organic TFT according to one embodiment of the invention.
Figure 11A:
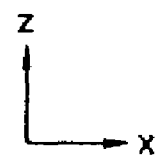
Figure 11B:
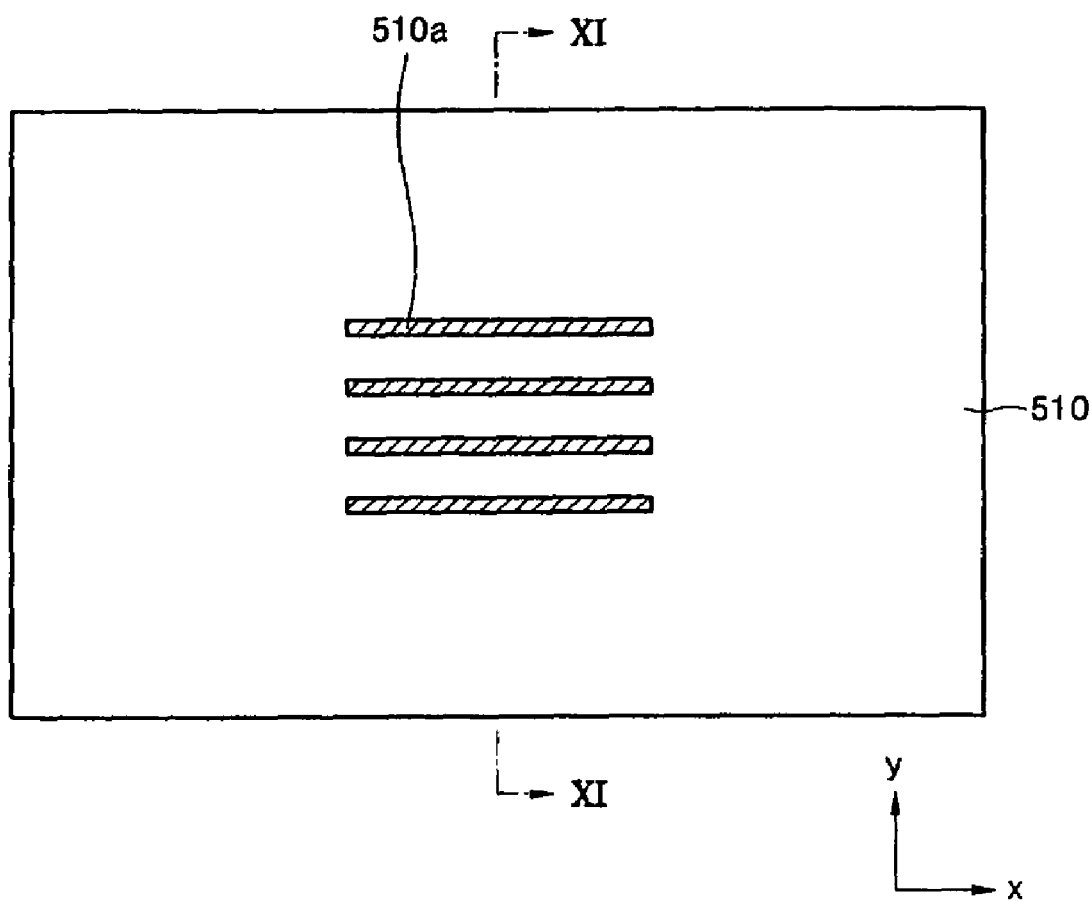
FIG. 11B is a plan view of a portion of the organic TFT of FIG. 11A.
Figure 11C:
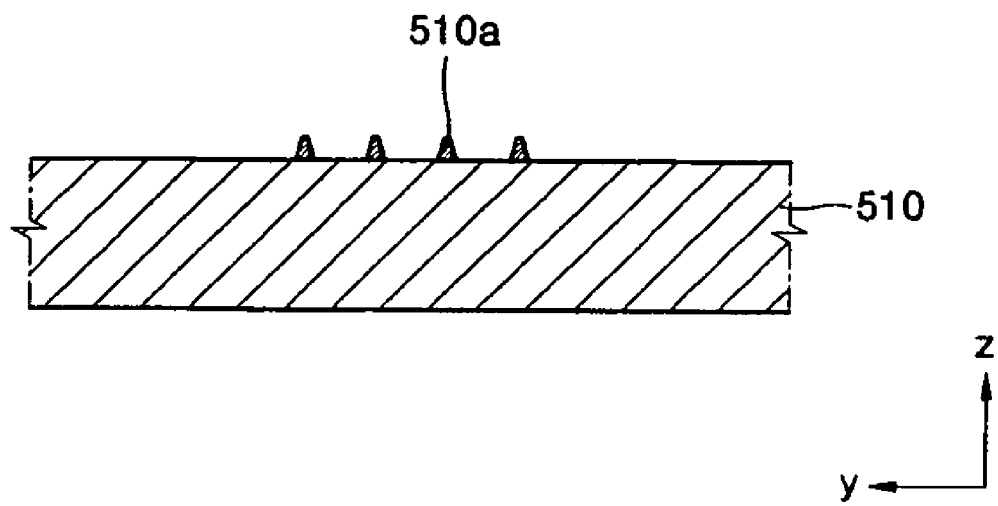
FIG. 11C is a cross sectional view of the portion of the organic TFT of FIG. 11B.
Figure 11D:
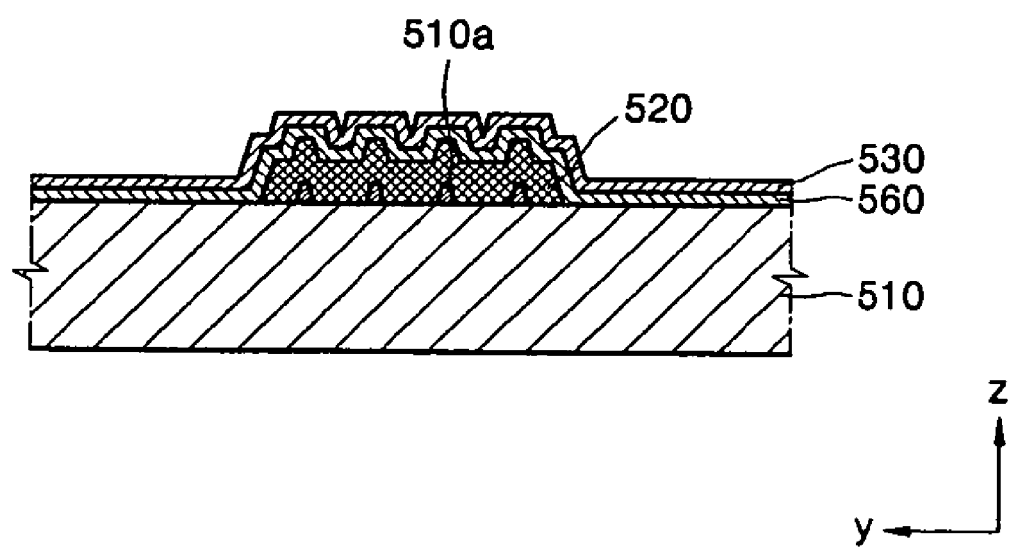
FIG. 11D is a cross sectional view of the organic TFT of FIG. 11A.
Figure 11E:
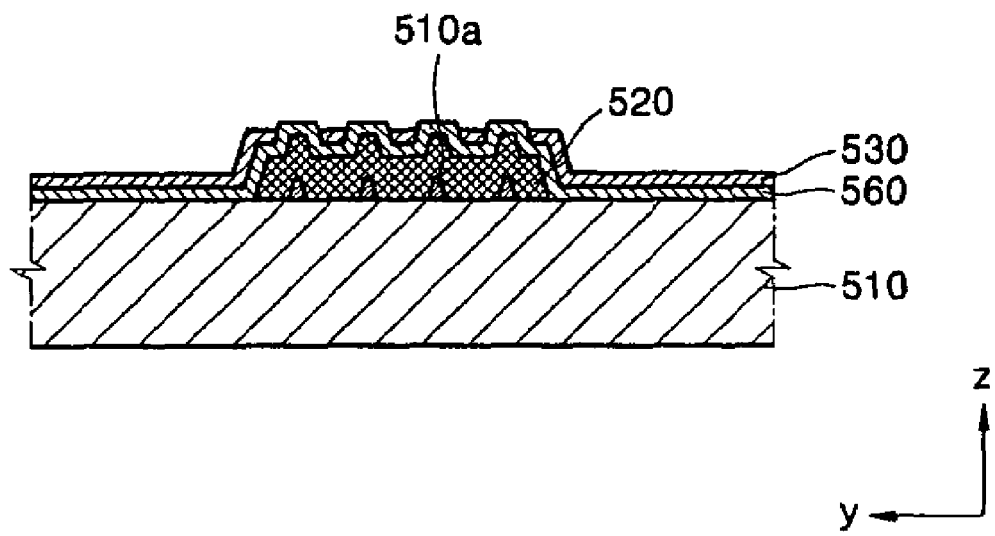
FIG. 11E is a cross sectional view illustrating an organic TFT according to another embodiment of the invention.

Referring to FIGS. 11A through 11E, an organic TFT according to a fifth embodiment will now be described. Generally, the organic TFT includes a gate electrode 520 formed on a substrate 510, a gate insulating film 560 covering the gate electrode 520, an organic semiconductor layer 530 on the gate insulating film 560, and a source electrode 540 and a drain electrode 550 that contact the organic semiconductor layer 530. The organic TFT can further include a buffer layer not shown on an upper surface of the substrate 510. Protrusions may be formed in the gate insulating film, as depicted in FIGS. 11A and 11E.

In this embodiment, a plurality of protrusion members 510a is formed on a substrate 510 disposed under the gate electrode 520. This can result in a plurality of protrusions on a gate electrode 520 that is formed over the protrusion members 510a. A gate insulating film 560 formed over the gate electrode 520 may also have a plurality of protrusions. Generally, all of the protrusions may be aligned in substantially the same direction as the protrusion members 510a.

As depicted in FIG. 11D, the organic semiconductor layer 530 can be formed to cover the gate insulating film 560 and the protrusions on the gate insulating film 560, or, as depicted in FIG. 11E, can be disposed between the protrusions on the gate insulating film 560. Generally, the organic semiconductor layer 530 can be formed such that it is aligned in the same direction as the protrusions and protrusion members 510a.

Figure 12:
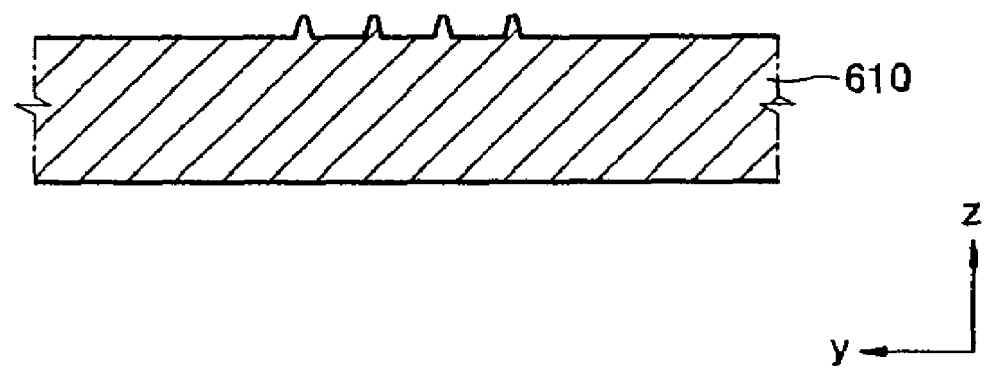
FIG. 12 is a cross-sectional view illustrating a portion of an organic TFT according to yet another embodiment of the invention.

Referring to the embodiment depicted in FIG. 12, a plurality of protrusion members is formed on a substrate 610. In this embodiment, the protrusion members are integrally formed as one body with the substrate 610 on an upper surface of the substrate 610. This can result in a plurality of protrusions on a gate electrode that is formed over the protrusion members. A gate insulating film formed over the gate electrode may also have a plurality of protrusions. Generally, all of the protrusions may be aligned in substantially the same direction as the protrusion members. An organic semiconductor layer can be formed to cover the gate insulating film and protrusions on the gate insulating film, or can be disposed between the protrusions on the gate insulating film. Generally, the organic semiconductor layer can be formed such that it is aligned in the same direction as the protrusions and protrusion members.

Referring to the embodiment depicted in FIGS. 13A through 13E, an organic TFT according to a seventh embodiment will now be described. Generally, the organic TFT includes a gate electrode 720 formed on a substrate 710, a gate insulating film 760 covering the gate electrode 720, an organic semiconductor layer 730 on the gate insulating film 760, and a source electrode 740 and a drain electrode 750 that contact the organic semiconductor layer 730.

Figure 13A:
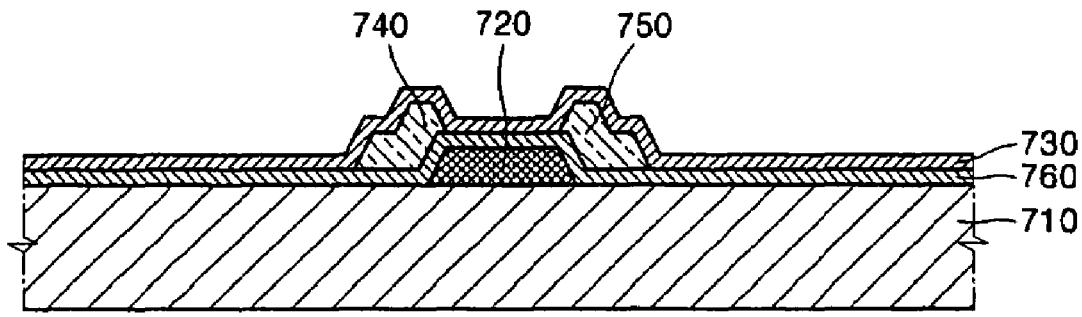
FIG. 13A is a cross-sectional view illustrating an organic TFT according to one embodiment of the invention.
Figure 13A:
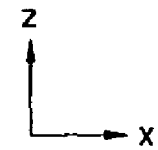
Figure 13B:
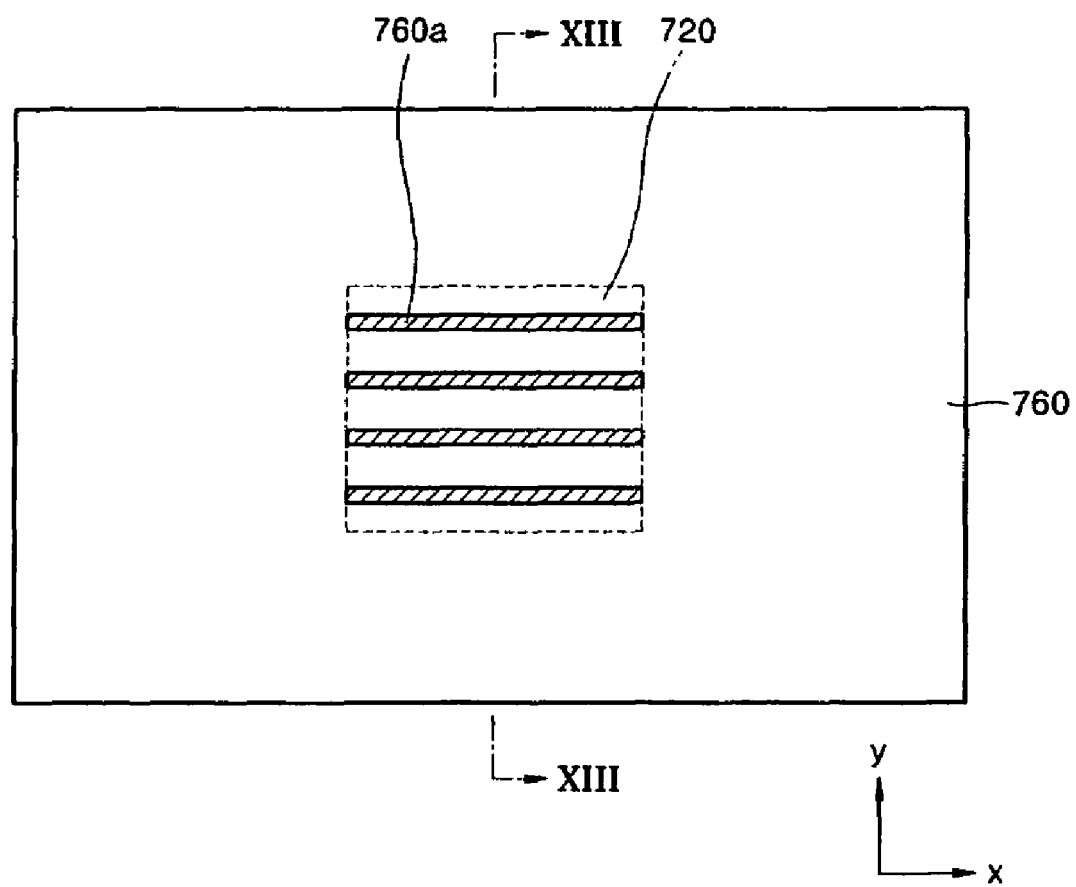
FIG. 13B is a plan view of a portion of the organic TFT of FIG. 13A.
Figure 13C:
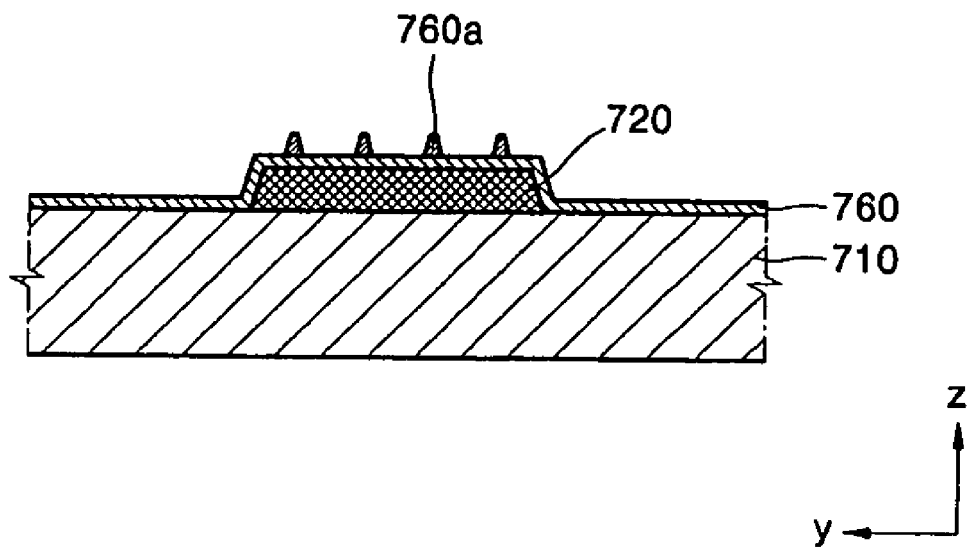
FIG. 13C is a cross sectional view of the portion of the organic TFT of FIG. 13B.
Figure 13D:
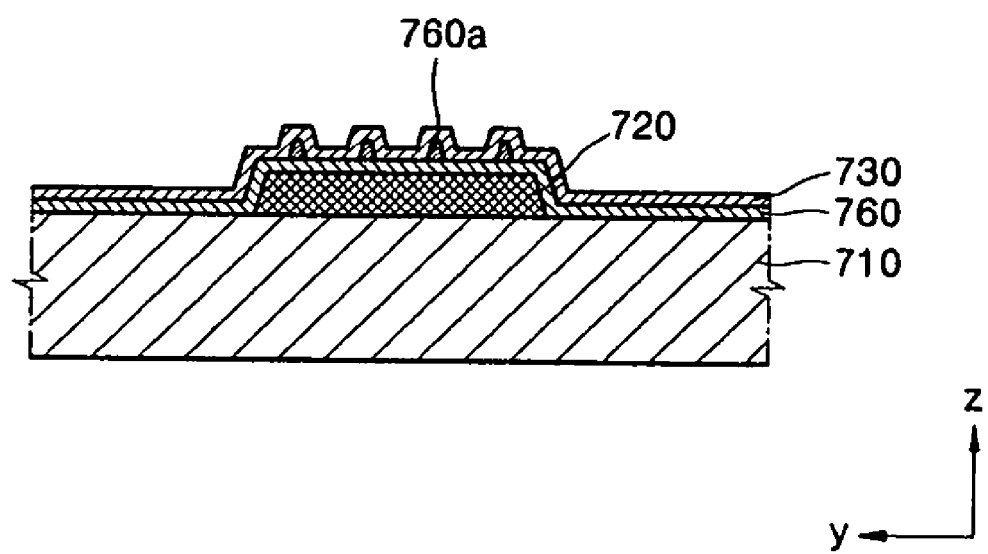
FIG. 13D is a cross sectional view of the organic TFT of FIG. 13A.
Figure 13E:
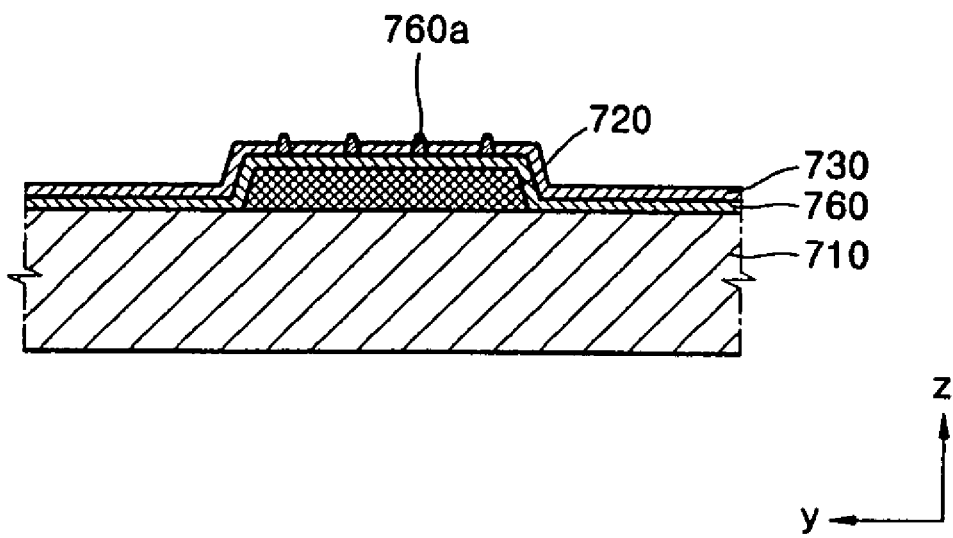
FIG. 13E is a cross sectional view illustrating an organic TFT according to another embodiment of the invention.

As depicted in FIGS. 13B and 13C, a plurality of protrusion members 760a can be formed on an upper surface of the gate insulating film 760. As depicted in FIG. 13D, the organic semiconductor layer 730 can be formed to cover the gate insulating film 760 and protrusion members 760a, or, as depicted in FIG. 13E, can be disposed between the protrusion members 760a on the gate insulating film 760. Generally, the organic semiconductor layer 730 can be formed such that it is aligned in the same direction as the protrusion members 760a.

Figure 14:
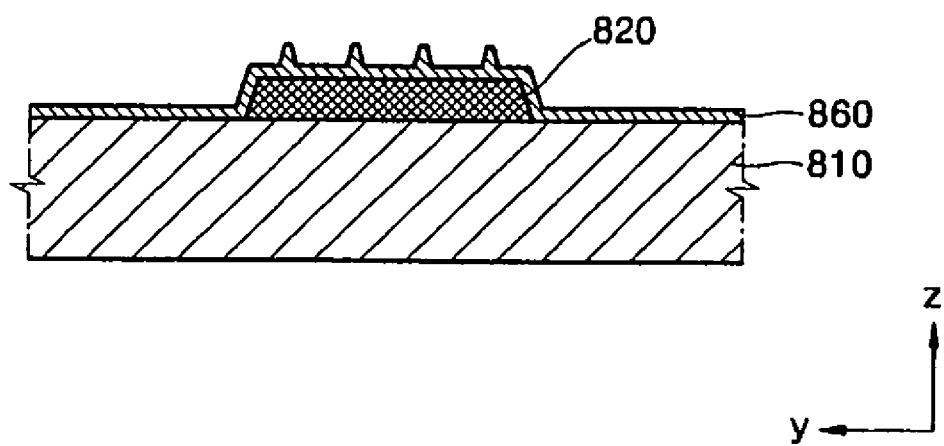
FIG. 14 is a cross-sectional view illustrating a portion of an organic TFT according to yet another embodiment of the invention.

Referring to the embodiment of FIG. 14, a plurality of protrusion members is formed on a gate insulating film 860. In this embodiment, the protrusion members are integrally formed as one body with the gate insulating film 860 on an upper surface of the gate insulating film 860.

An organic semiconductor layer can be formed to cover the gate insulating film and protrusion members, or can be disposed between the protrusion members on the gate insulating film. Generally, the organic semiconductor layer can be formed such that it is aligned in the same direction as the protrusion members.

Referring to FIGS. 15A through 15E, an organic TFT according to a ninth embodiment will now be described. Generally, the organic TFT includes an organic semiconductor layer 930 on a substrate 910, a gate electrode 920 insulated from the organic semiconductor layer 930 and disposed above the organic semiconductor layer 930, and a source electrode 940 and a drain electrode 950 that contact the organic semiconductor layer 930 and are insulated from the gate electrode 920.

The organic TFT according to the ninth embodiment can further include a gate insulating film 960 that is formed over the organic semiconductor layer 930 and insulates the source electrode 940, the drain electrode 950, and the organic semiconductor layer 930 from the gate electrode 920. Some embodiments may also include a buffer layer (not shown) that can be located between the substrate 910 and the organic semiconductor layer 930. The same is applicable to other embodiments of the invention.

Generally, a plurality of protrusion members 910a is formed on a surface of the substrate 910 that faces the organic semiconductor layer 930.

Figure 15A:
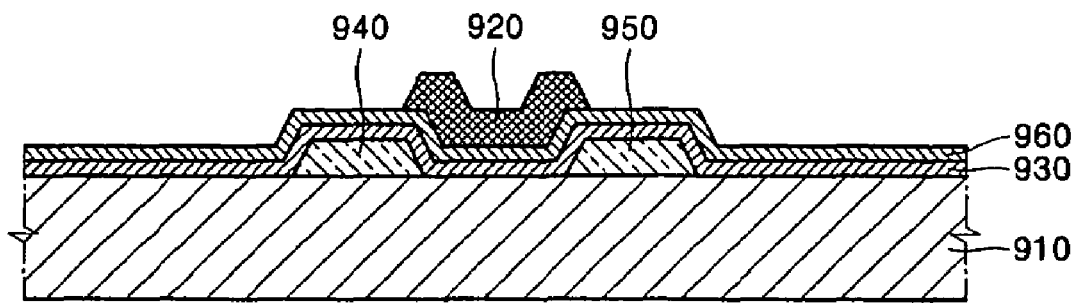
FIG. 15A is a cross-sectional view illustrating an organic TFT according to one embodiment of the invention.
Figure 15B:
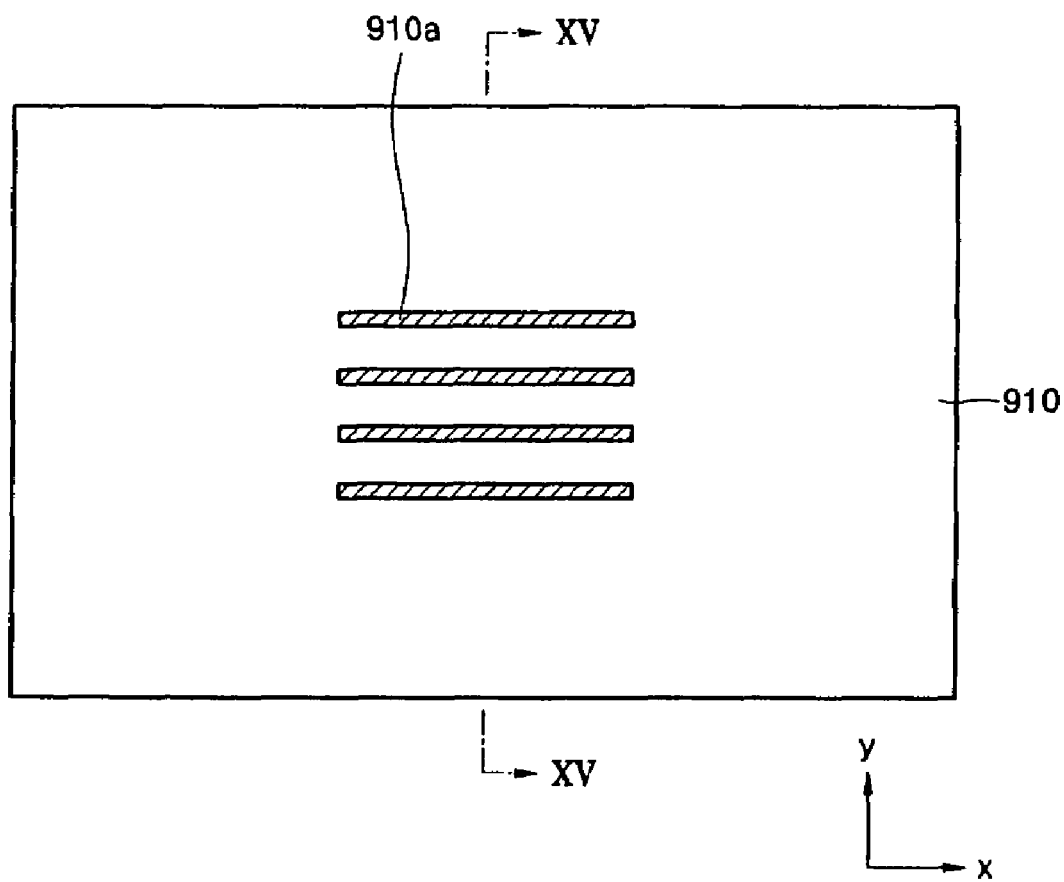
FIG. 15B is a plan view of a portion of the organic TFT of FIG. 15A.
Figure 15C:
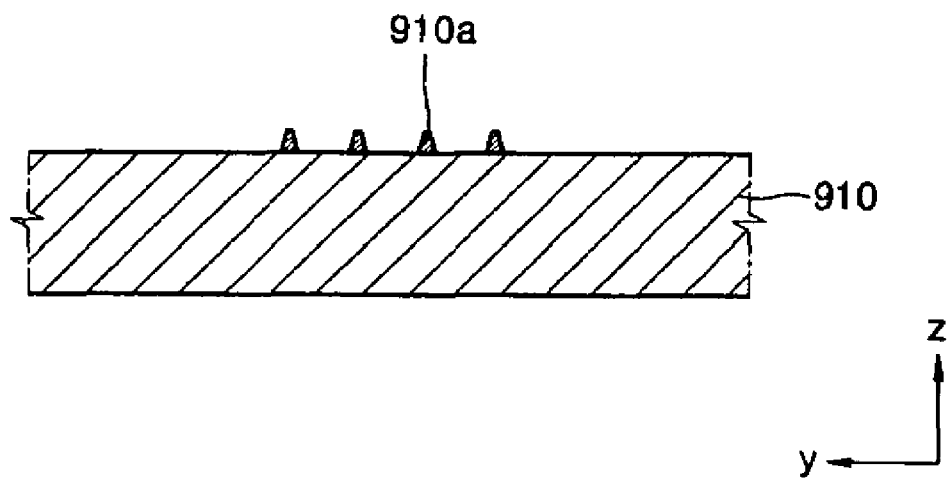
FIG. 15C is a cross sectional view of a portion of the organic TFT of FIG. 15B.
Figure 15D:
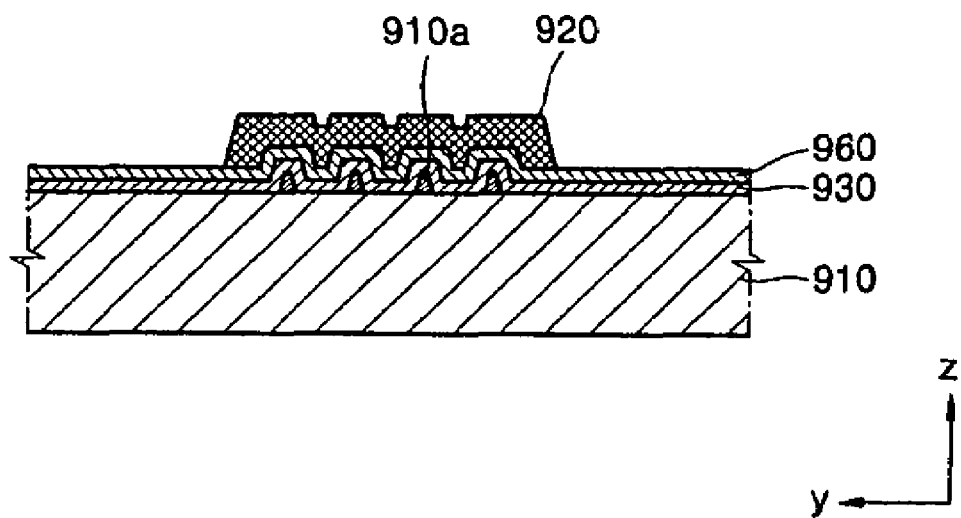
FIG. 15D is a cross sectional view of the organic TFT of FIG. 15A.
Figure 15E:
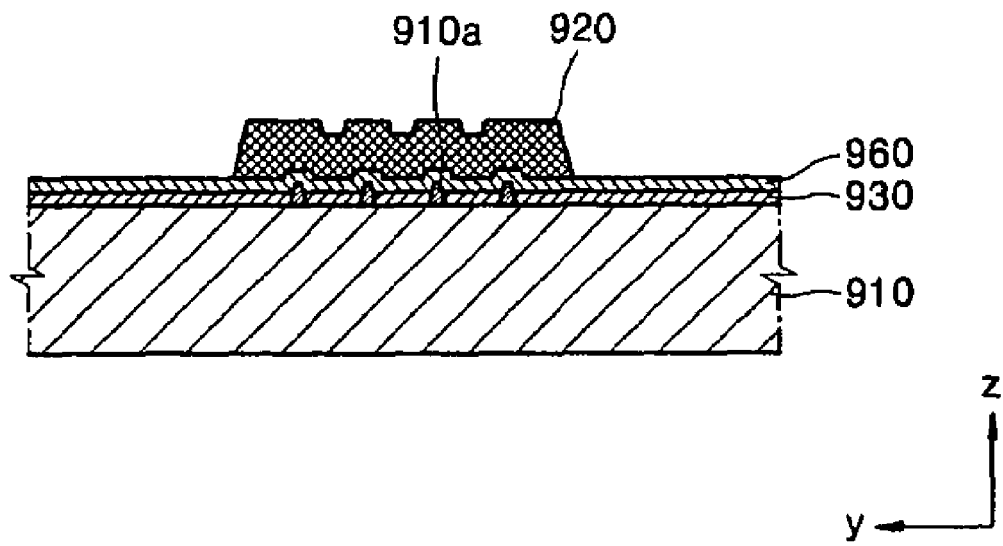
FIG. 15E is a cross sectional view illustrating an organic TFT according to another embodiment of the invention.

As depicted in FIG. 15D, the organic semiconductor layer 930 can be formed to cover the substrate 910 and the protrusion members 910a, or, as depicted in FIG. 15E, can be formed between the protrusion members 910a. Generally, the organic semiconductor layer can be formed such that is aligned in the same direction as the protrusion members.

As depicted in FIG. 15A, a staggered type organic TFT is described in the present embodiment. However, the present invention is not so limited, and can be applied to any structure of organic TFTs in which a gate electrode is disposed on an organic semiconductor layer, that is, top gate type organic TFTs. The same is applicable to the subsequent embodiments that are described later.

Figure 16:
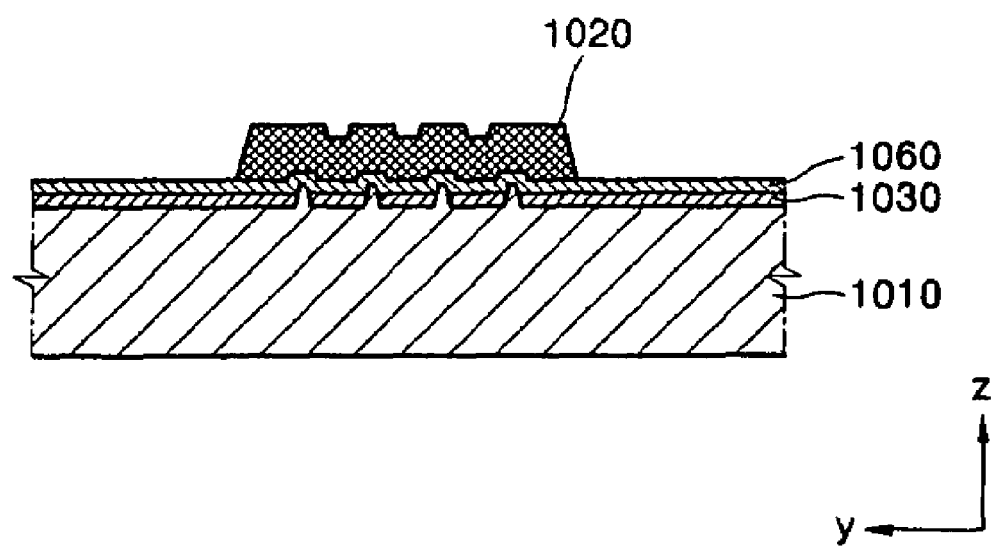
FIG. 16 is a cross-sectional view illustrating a portion of an organic TFT according to yet another embodiment of the invention.

Referring to the embodiment of FIG. 16, a plurality of protrusion members can be formed on a substrate 1010.

In this embodiment, the protrusion members are integrally formed as one body with the substrate 1010 on an upper surface of the substrate 1010. The organic semiconductor layer 1030 can be formed to cover the substrate 1010 and the protrusion members, or can be formed between the protrusion members. Generally, the organic semiconductor layer 1030 can be formed such that is aligned in the same direction as the protrusion members.

Referring to FIGS. 17A through 17E, an organic TFT according to an eleventh embodiment will now be described. Generally, the organic TFT includes a buffer layer 1170 formed on a substrate 1110, an organic semiconductor layer 1130 on the buffer layer 1170, a gate electrode 1120 insulated from the organic semiconductor layer 1130 above the organic semiconductor layer 1130, and a source electrode 1140 and a drain electrode 1150 that contact the organic semiconductor layer 1130 and are insulated from the gate electrode 1120.

In this embodiment, a plurality of protrusion members 1170a is formed on a surface of the buffer layer 1170 that faces the organic semiconductor layer 1130.

Figure 17A:
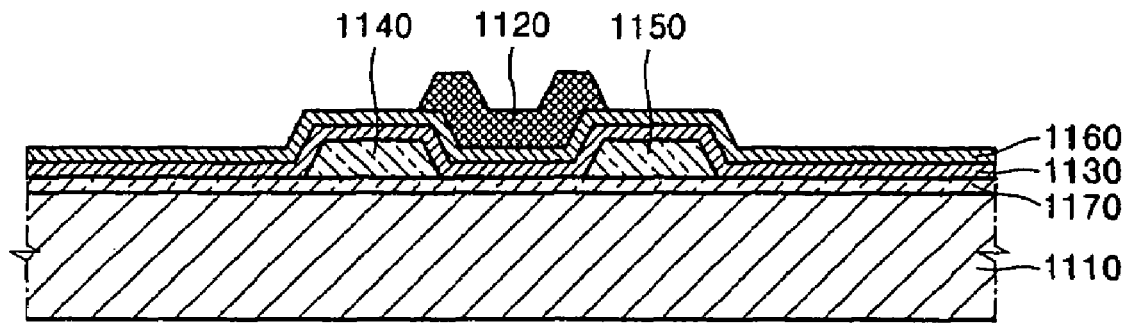
FIG. 17A is a cross-sectional view illustrating an organic TFT according to one embodiment of the invention.
Figure 17A:
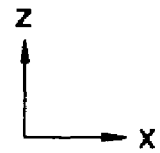
Figure 17B:
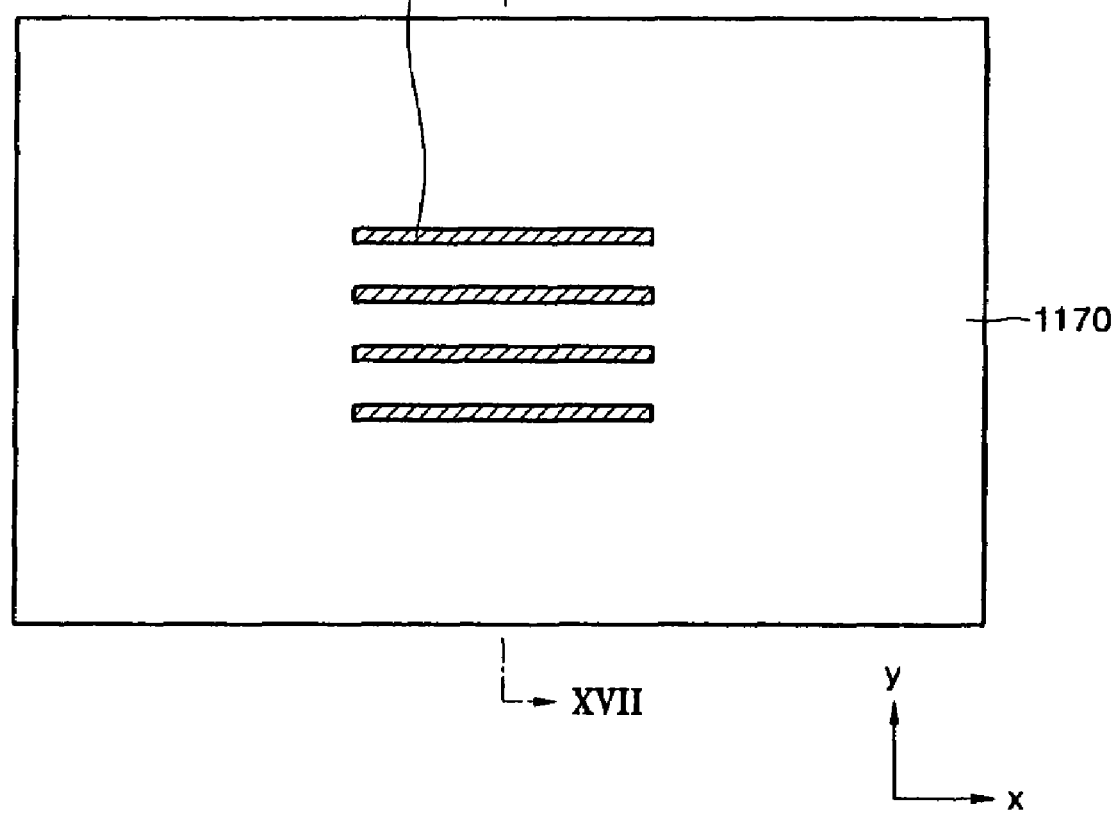
FIG. 17B is a plan view of a portion of the organic TFT of FIG. 17A.
Figure 17C:
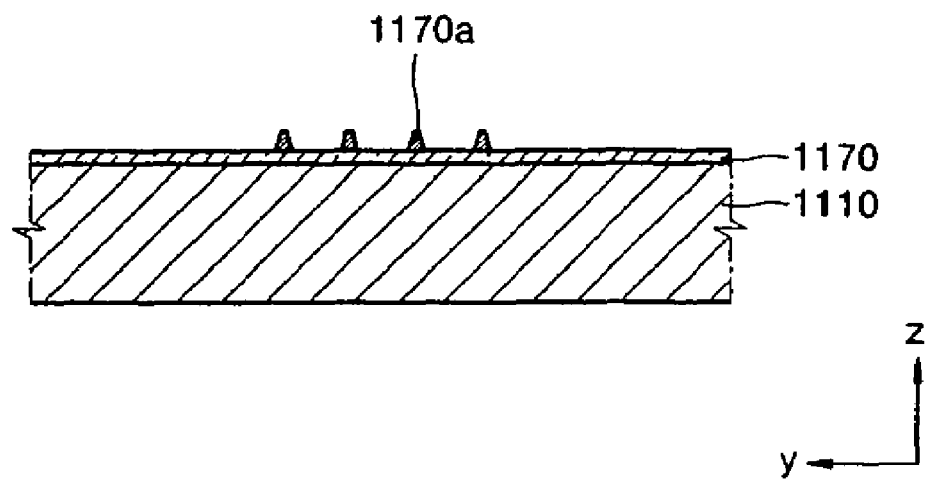
FIG. 17C is a cross sectional view of the portion of the organic TFT of FIG. 17B.
Figure 17D:
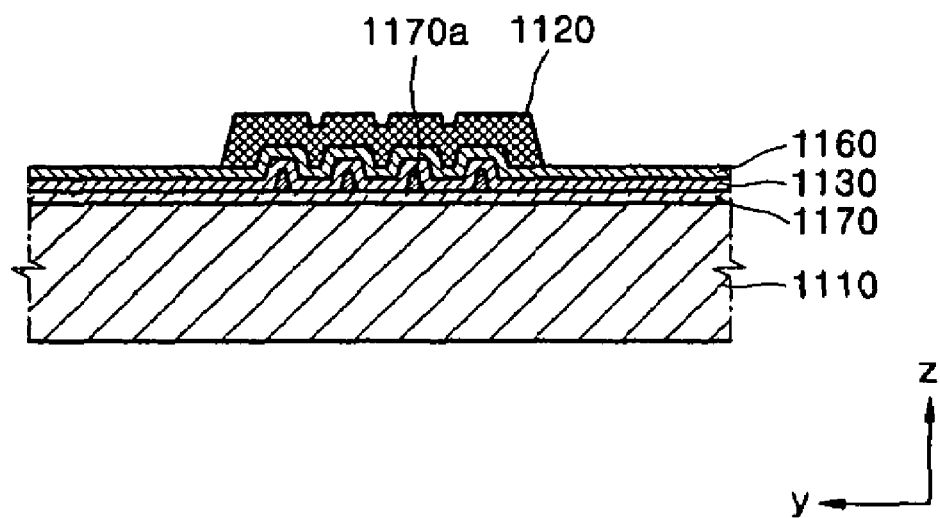
FIG. 17D is a cross sectional view of the organic TFT of FIG. 17A.
Figure 17E:
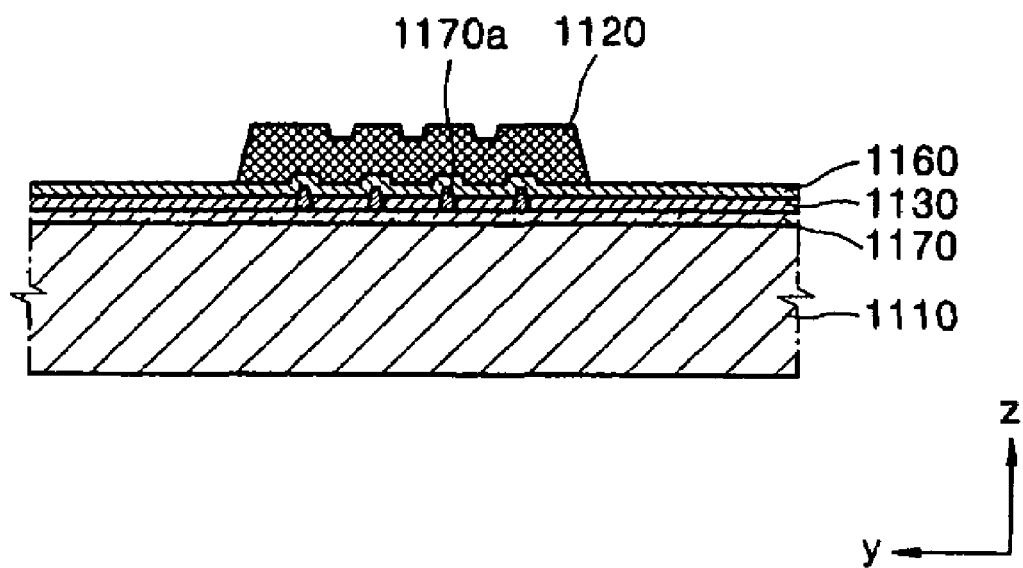
FIG. 17E is a cross sectional view illustrating an organic TFT according to another embodiment of the invention.

As depicted in FIG. 17D, the organic semiconductor layer 1130 can be formed to cover the buffer layer 1170 and the protrusion members 1170a, or, as depicted in FIG. 17E, can be formed between the protrusion members 1170a. Generally, the organic semiconductor layer 1030 can be formed such that is aligned in the same direction as the protrusion members 1170a.

Figure 18:
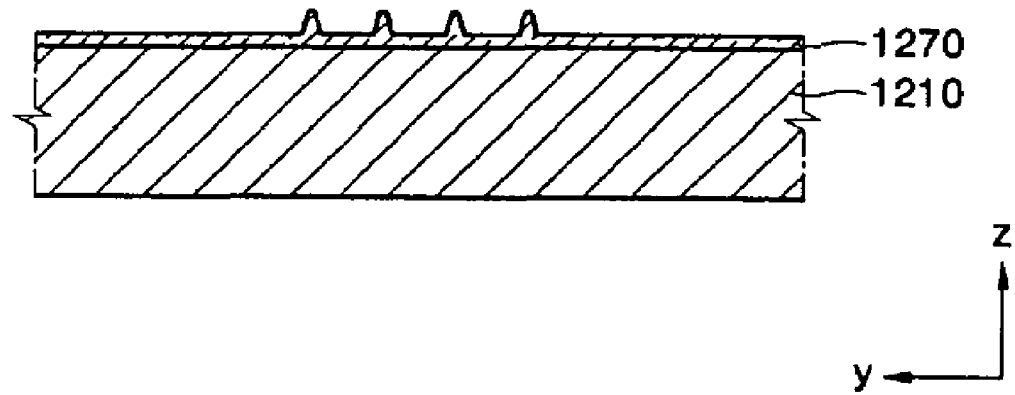
FIG. 18 is a cross-sectional view illustrating a portion of an organic TFT according to yet another embodiment of the invention.

Referring to the embodiment of FIG. 18, a plurality of protrusion parts is formed on a buffer layer 1270 formed on a substrate 1210.

In some embodiments, the protrusion members are integrally formed as one body with the buffer layer 1270 on an upper surface of the buffer layer 1270. The organic semiconductor layer can be formed to cover the buffer layer 1270 and the protrusion members, or can be formed between the protrusion members. Generally, the organic semiconductor layer can be formed such that is aligned in the same direction as the protrusion members.

Generally, the buffer layer may be formed using a photosensitive material, i.e., a polymer film such as a photoresist or a photoaligning material, and the protrusion members can be formed using the aforementioned laser hologram method.

In some embodiments, the organic TFTs of the invention can be used on a device that requires a plurality of organic TFTs. Some embodiments of the invention provide simultaneously manufactured organic TFTs on the same substrate with substantially identical threshold voltages. This is especially useful in flat panel displays because the operation of each pixel may be controlled by at least one organic TFT. If the characteristics of the organic TFT included in each pixel are different, clear images according to the input image information cannot be displayed. Therefore, in a flat panel display that includes a plurality of organic TFTs, clear and high-resolution images can be obtained by using the organic TFTs according to some embodiments of the present invention.

Examples of flat panel displays that use organic TFTs include electroluminescence displays and LCDs. The structure of a electroluminescence display will now be described briefly.

The electroluminescence display includes a variety of pixel patterns. These patterns may be formed by red, green, and/or blue pixels, according to the color emitted from a light emission layer. Each of the sub-pixels formed of red, green, and blue color includes an electroluminescence device and at least one TFT connected to the electroluminescence device. The TFTs can be the organic TFTs according to the embodiments of the invention. A capacitor can also be included in the electroluminescence display.

The electroluminescence device is a current driven, light emission device and displays predetermined images by emitting lights of red, green, or blue colors according to the current flow between two electrodes. The electroluminescence device includes a pixel electrode connected to one of the source electrode and the drain electrode of an organic TFT, a facing electrode formed to cover the entire pixels or to correspond to each pixel, and an intermediate layer that includes at least a light emitting layer interposed between the pixel electrode and facing electrode. The present invention is not limited to the above structure and can be applied to various structures of electroluminescence device.

The pixel electrode functions as an anode and the facing electrode functions as a cathode. Of course, the polarity of the pixel and facing electrodes can be reversed.

The pixel electrode can be used as a transparent electrode or a reflection electrode. When the pixel electrode is used as the transparent electrode, the pixel electrode can be formed of ITO, IZO, ZnO, or $In_2O_3$. When the pixel electrode is used as the reflection electrode, the pixel electrode can be formed of ITO, IZO, ZnO, or $In_2O_3$ on a reflection film after forming the reflection film using Ag, Mg, Al, Pt, Pd, Au, Ni, Nd, Ir, Cr, or a compound of these metals.

The facing electrode can also be used as a transparent electrode or a reflection electrode. When the facing electrode is used as the transparent electrode, an auxiliary electrode layer or a bus electrode line formed of a material for forming the transparent electrode, such as ITO, IZO, ZnO, or $In_2O_3$, can be included on a material layer after depositing the material layer formed of a metal having a low work function, such as Li, Ca, LiF/Ca, LiF/Al, Al, Ag, Mg, or a compound of these metals facing the intermediate layer which is an organic film. When the facing electrode is used as the reflection electrode, the facing electrode is formed by entirely depositing Li, Ca, LiF/Ca, LiF/Al, Al, Ag, Mg, or a compound of these metals. However, the invention is not limited thereto and an organic material such as a conductive polymer can be used as the pixel and facing electrodes.

The intermediate layer formed of an organic film can include a low molecular weight organic film or a polymer organic film. If the intermediate layer is formed of a low molecular weight organic film, the intermediate layer can be formed in a single or a composite structure by stacking a Hole Injection Layer (HIL), a Hole Transport Layer (HTL), an Emission Layer (EML), an Electron Transport Layer (ETL), and an Electron Injection Layer (EEL). An organic material that can be used for forming the intermediate layer includes copper phthalocyanine (CuPc), N,N'-Di(naphthalene-1-yl)-N,N'-diphenyl-benzidine (NPB), and tris-8-hydroxyquinoline aluminum (Alq3). The low molecular weight organic film can be formed by an evaporation method. The structure of the intermediate layer is not limited thereto.

If the intermediate layer is formed of a polymer organic film, the intermediate layer can include a HTL and an EML. The polymer HTL can be formed by poly-(2,4)-ethylenedihydroxy thiophene (PEDOT) or polyaniline (PANI) using an inkjet printing or a spin coating method. The polymer organic light emitting layer can be formed of Poly-Phenylenevinylene (PPV), Soluble PPV's, Cyano-PPV, or Polyfluorene and a color pattern is formed using conventional methods such as an ink jet printing, a spin coating, or a thermal transfer method using a laser. The structure of the intermediate layer in the polymer organic layer is not limited thereto.

In the electroluminescence display having the above structure, the light emission of each pixel can be controlled by controlling the current flow input to the pixel electrode by at least one organic TFT, the characteristics of threshold voltage of which is uniform by aligning the organic semiconductor layer in an identical direction, connected to the pixel electrode of the electroluminescence device.

The organic TFTs according to the embodiments of the present invention can be included not only in the electroluminescence displays or LCDs but also other electronic equipment that use organic TFT, such as electronic sheets, smart cards, product tags or plastic chips for a RFID.

The organic TFT according to the invention and the flat panel displays that include the organic TFT can provide the following advantages:

In some embodiments, the organic semiconductor layer can be aligned in substantially the same direction as a plurality of protrusion members that are parallel with respect to each other and extend in a substantially identical direction.

Generally, forming the organic semiconductor layer in substantially the same direction as the protrusion members allows simultaneously manufactured organic TFTs to be formed in substantially identical directions with respect to each other. Advantageously, this allows organic TFTs to have substantially similar threshold voltages.

Generally, a flat panel display can display clear and high resolution images according to the input image information provided by simultaneously manufactured organic TFTs with substantially identical characteristics.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic thin film transistor (TFT) comprising:
a substrate;
a gate electrode disposed on the sub straw;
a gate insulating film covering the gate electrode;
an organic semiconductor layer disposed on the gate insulating film; and
a source electrode and a drain electrode that contact the organic semiconductor layer,
wherein a plurality of protrusions are formed on the gate insulating film and are arranged in an orientation that extends from the source electrode to the drain electrode, wherein each of the plurality of protrusions has a width and a length which is substantially greater than the width, and wherein the length of each of the protrusions extends in a direction from the source electrode to the drain electrode.

2. The organic TFT of claim 1, wherein the protrusions are arranged in a parallel alignment.

3. An organic thin film transistor (TFT) comprising:
a substrate;
a gate electrode disposed on the substrate;
a gate insulating film covering the gate electrode;
an organic semiconductor layer disposed on the gate insulating film;
a source electrode and a drain electrode that contact the organic semiconductor layer, wherein a plurality of protrusions are formed on the gate insulating film and are arranged in an orientation that extends from the source electrode to the drain electrode; and
a plurality of protrusion members formed on a surface of the gate electrode, the surface of the gate electrode facing the gate insulating film, and the protrusion members are arranged in an orientation that extends from the source electrode to the drain electrode.

4. The organic TFT of claim 3, wherein the protrusion members are arranged in a parallel alignment.

5. The organic TFT of claim 3, wherein the protrusion members are formed of a photosensitive material.

6. The organic TFT of claim 5, wherein the photosensitive material is one of a photoresist and a photoaligning material.

7. The organic TFT of claim 3, wherein the protrusion members are integrally formed as one body with the gate electrode.

8. The organic TFT of claim 1, further comprising a buffer layer formed between the substrate and the gate electrode.

9. An organic thin film transistor (TFT) comprising:
a substrate;
a gate electrode disposed on the substrate;
a gate insulating film covering the gate electrode;
an organic semiconductor layer disposed on the gate insulating film;
a source electrode and a drain electrode that contact the organic semiconductor layer, wherein a plurality of protrusions are formed on the gate insulating film and are arranged in an orientation that extends from the source electrode to the drain electrode;
a buffer layer formed between the substrate and the gate electrode; and
a plurality of protrusion members formed on a surface of the buffer layer, the surface facing the gate electrode, and the protrusion members are arranged in an orientation that extends from the source electrode to the drain electrode.

10. The organic TFT of claim 9, wherein the protrusion members are arranged in a parallel alignment.

11. The organic TFT of claim 9, wherein the protrusion members are formed of a photosensitive material.

12. The organic TFT of claim 9, wherein the photosensitive material is one of a photoresist and a photoaligning material.

13. The organic TFT of claim 9, wherein the protrusion members are integrally formed as one body with the buffer layer.

14. The organic TFT of claim 13, wherein the buffer layer is formed of a photosensitive material.

15. The organic TFT of claim 14, wherein the photosensitive material is one of a photoresist and a photoaligning material.

16. An organic thin film transistor (TFT) comprising:
a substrate;
a gate electrode disposed on the substrate;
a gate insulating film covering the gate electrode;
an organic semiconductor layer disposed on the gate insulating film;
a source electrode and a drain electrode that contact the organic semiconductor layer, wherein a plurality of protrusions are formed on the gate insulating film and are arranged in an orientation that extends from the source electrode to the drain electrode; and
a plurality of protrusion members on a surface of the substrate, the surface of the substrate facing the gate electrode, and the protrusion members are arranged in an orientation that extends from the source electrode to the drain electrode.

17. The organic TFT of claim 16, wherein the protrusion members are arranged in a parallel alignment.

18. The organic TFT of claim 16, wherein the protrusion members are formed of a photosensitive material.

19. The organic TFT of claim 18, wherein the photosensitive material is one of a photoresist and a photoaligning material.

20. The organic TFT of claim 16, wherein the protrusion members are integrally formed as one body with the substrate.

21. A flat panel display that comprises a plurality of TFTs as recited in claim 1.

22. An organic TFT comprising:
a substrate;
a gate electrode disposed on the substrate;
a gate insulating film covering the gate electrode;
an organic semiconductor layer disposed on the gate insulating film; and
a source electrode and a drain electrode that contact the organic semiconductor layer,
wherein a plurality of protrusion members are formed on a first surface of the gate insulating film, the first surface being opposite a second surface of the gate insulating film that contacts the gate electrode, and the protrusion members are arranged in an orientation that extends from the source electrode to the drain electrode, wherein each of the plurality of protrusion members has a width and a length which is substantially greater than the width, and wherein the length of each of the protrusion members extends in a direction from the source electrode to the drain electrode.

23. The organic TFT of claim 22, wherein the protrusion members are arranged in a parallel alignment.

24. The organic TFT of claim 22, wherein the protrusion members are formed of a photosensitive material.

25. The organic TFT of claim 24, wherein the photosensitive material is one of a photoresist and a photoaligning material.

26. The organic TFT of claim 22, wherein the protrusion members are integrally formed as one body with the gate insulating film.

27. An organic TFT comprising:
a substrate;
a gate electrode disposed on the substrate;
a gate insulating film covering the gate electrode;
an organic semiconductor layer disposed on the gate insulating film; and
a source electrode and a drain electrode that contact the organic semiconductor layer, wherein a plurality of protrusion members are formed on a first surface of the gate insulating film, the first surface being opposite a second surface of the gate insulating film that contacts the gate electrode, and the protrusion members are arranged in an orientation that extends from the source electrode to the drain electrode,
wherein the protrusion members are integrally formed as one body with the gate insulating film, and
wherein the gate insulating film is formed of a photosensitive material.

28. The organic TFT of claim 27, wherein the photosensitive material is one of a photoresist and a photoaligning material.

29. A flat panel display that comprises a plurality of TFTs as recited in claim 22.

30. An organic thin film transistor (TFT) comprising:
a substrate;
a gate electrode;
a gate insulating film;
an organic semiconductor layer; and
a plurality of protrusion members that are oriented in a pre-determined direction and are formed on one of the substrate, the gate electrode, and the gate insulating film, wherein each of the plurality of protrusion members has a width and a length which is substantially greater than the width, and wherein the length of each of the protrusion members extends in a direction from the source electrode to the drain electrode;
wherein at least a portion of the organic semiconductor layer is formed in the direction in which the protrusion members extends.

31. A flat panel display that comprises a plurality of TFTs as recited in claim 30.

32. The organic TFT of claim 1, wherein each of the plurality of protrusions continuously extends from the source electrode to the drain electrode, wherein the gate electrode comprises a surface contacting the gate insulating film, and wherein a length of a row of each of the plurality of protrusions is less than or substantially the same as that of a row of the surface of the gate electrode.

33. The organic TFT of claim 22, wherein each of the plurality of protrusion members continuously extends from the source electrode to the drain electrode, wherein the gate electrode comprises a surface contacting the gate insulating film, and wherein a length of a row of each of the plurality of protrusion members is less than or substantially the same as that of a row of the surface of the gate electrode.

34. The organic TFT of claim 30, wherein each of the plurality of protrusion members continuously extends from the source electrode to the drain electrode, wherein the gate electrode comprises a surface contacting the gate insulating film, and wherein a length of a row of each of the plurality of protrusion members is less than or substantially the same as that of a row of the surface of the gate electrode.

* * * * *

UNITED STATES PATENT AND TRADEMARK OFFICE
CERTIFICATE OF CORRECTION

PATENT NO. : 7,582,894 B2  Page 1 of 1
APPLICATION NO. : 11/280105
DATED : September 1, 2009
INVENTOR(S) : Suh et al.

It is certified that error appears in the above-identified patent and that said Letters Patent is hereby corrected as shown below:

| Column | Line | Description of Error |
|---|---|---|
| Title Page, Page 1 (Item 73) Assignee | 1 | Change "Displays" to --Display--. |
| 1 | 34 | Change "(ELD)," to --(ELDs),--. |
| 4 | 44 | Change "film" to --film.--. |
| 6 | 58-59 | Change "protusions" to --protrusions--. |
| 13 | 13 (Approx.) | Change "(EEL)." to --(EIL).--. |
| 13 | 26 (Approx.) | Change "PPV's," to --PPVs,--. |
| 14 | 4 | In Claim 1, change "sub straw;" to --substrate;--. |

Signed and Sealed this

Twenty-second Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,582,894 B2
APPLICATION NO. : 11/280105
DATED : September 1, 2009
INVENTOR(S) : Suh et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 776 days.

Signed and Sealed this

Fourteenth Day of December, 2010

David J. Kappos
*Director of the United States Patent and Trademark Office*